(12) United States Patent
Kanda et al.

(10) Patent No.: US 7,786,785 B2
(45) Date of Patent: Aug. 31, 2010

(54) PEAKING CONTROL CIRCUIT

(75) Inventors: Kouichi Kanda, Kawasaki (JP);
Hirotaka Tamura, Kawasaki (JP);
Hisakatsu Yamaguchi, Kawasaki (JP);
Junji Ogawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 12/239,542

(22) Filed: Sep. 26, 2008

(65) Prior Publication Data
US 2009/0066394 A1    Mar. 12, 2009

Related U.S. Application Data

(63) Continuation of application No. PCT/JP2006/306186, filed on Mar. 27, 2006.

(51) Int. Cl.
*G06F 1/04* (2006.01)

(52) U.S. Cl. .................................. 327/291; 327/300

(58) Field of Classification Search .............. 327/291, 327/292, 293, 294, 295, 296, 297, 298, 299, 327/300
See application file for complete search history.

(56) References Cited

U.S. PATENT DOCUMENTS 5,652,545 A    7/1997    Miyashita et al.
6,087,899 A    7/2000    Kubota
6,680,655 B2 *    1/2004    Rogers ................... 331/109
6,909,336 B1 *    6/2005    Rajagopalan et al. ....... 331/183
7,126,403 B2 *    10/2006    Kenney et al. ............. 327/291
7,196,592 B2 *    3/2007    Shi et al. ............... 331/117 FE

FOREIGN PATENT DOCUMENTS

| JP | 4-258015 A | 9/1992 |
|---|---|---|
| JP | 9-8565 A | 1/1997 |
| JP | 9-64920 A | 3/1997 |
| JP | 10-163856 A | 6/1998 |
| JP | 2002-217483 A | 8/2002 |

* cited by examiner

*Primary Examiner*—Jeffrey S Zweizig
(74) *Attorney, Agent, or Firm*—Fujitsu Patent Center

(57) ABSTRACT

There are provided a peaking detection part detecting a peaking amount in an output part of an inductor peaking circuit and a control signal generation part varying a circuit parameter of the inductor peaking circuit based on the peaking amount detected by the peaking detection part. Particularly, the inductor peaking circuit has inductors and resistors inserted in series between the output part and a power supply, and capacitances coupled in parallel between the output part and an earth (GND), and depending on respective values of these inductors, resistors and capacitances, it is possible to suppress a peaking generated in the output part.

11 Claims, 19 Drawing Sheets

PEAKING CONTROL CIRCUIT

CROSS-REFERENCE TO RELATED APPLICATION

This application is a Continuation Application of International Application No. PCT/JP2006/306186, filed Mar. 27, 2006, designating the U.S., the entire contents of which are incorporated herein by reference.

BACKGROUND

1. Field

The present embodiment relates to a parameter control circuit automatically controlling a circuit characteristic in accordance with an operation clock.

2. Description of the Related Art

The present embodiment relates to a technique for controlling a peaking in a circuit which transmits a high-frequency signal.

In recent years, an information amount to be processed has been increasing in computer and communication fields. In order to deal with the information amount which tends to be increased, a computing speed of an LSI (Large Scale Integrated circuit) is increased, and there is required to transmit a high-frequency signal in a digital data transmitting and receiving circuit with a cable, an analog circuit of a high-frequency wireless device and the like. For instance, in a data transmission circuit performing a data communication at high speed, there is a need to convert a plurality of low-speed parallel signals into high-speed serial signals. Further, high-speed clock signals which determine operation timings of these circuits are also required. Generally, when a transmission rate of data is high, an operating speed of an output driver at a transmitting side is fast, so that the clock signal of high-frequency according to the operating speed becomes necessary, and a speeding up of the circuit itself is an important task.

For example, in a circuit performing a data transmission using a clock of high speed, a peaking (overshoot or the like) is generated in a signal wave form of the data to transmit. Due to the generation of the peaking, the signal wave form may be distorted or a voltage higher than a withstand voltage may be applied to the circuit. In order to prevent this, there is known a method in a conventional art called "inductor peaking" in which the peaking is suppressed using the inductor. In other words, it is a method to suppress the peaking by optimizing a value of the inductor so that it has a characteristic being optimal for a frequency of a signal to transmit.

For instance, Patent Document 1 (Japanese Laid-open Patent Publication No. 2002-217483) discloses a technique for reducing the overshoot in a laser diode drive circuit by coupling inductors in series with both pull-up resistors at a non-inverted output side and an inverted output side of a differential amplifier.

However, a state of peaking is determined based on a load resistor of a circuit, a small signal parameter of a transistor, a capacitance value of an output node or the like. For instance, when the inductor takes a value larger than an optimal value, a state called an over-peaking is generated, resulting that a signal wave form to transmit is distorted. On the contrary, when the value of inductor becomes smaller than the optimal value, a frequency band becomes narrow, which eliminates a chance to deal with a speed up of the circuit.

Generally, a circuit design is conducted so that the inductor takes the optimal value, and it is difficult to be changed after manufacturing the LSI. Meanwhile, a value of a resistor, the small parameter of the transistor, a capacitance or the like varies depending on a variation in a manufacturing process of a semiconductor, a change in a temperature and a voltage when operating the LSI, or the like, so that the optimal value of the inductor also varies.

As described above, the optimal value of the inductor varies depending on various causes, and it is difficult to uniquely determine, at the time of design, the optimal value of the inductor with which the peaking is not generated all the time. Particularly, if a manufacturing variation becomes large because of a miniaturization of a semiconductor process, it becomes further difficult to manufacture mass-produced products with stabilized quality.

SUMMARY

According to an aspect of the embodiment, a peaking control circuit, including an inductor peaking circuit, a peaking detection part detecting a peaking amount in an output part of the inductor peaking circuit, and a control signal generation part varying a circuit parameter of the inductor peaking circuit based on the peaking amount detected by the peaking detection part.

DETAILED DESCRIPTION OF THE EMBODIMENTS

Before explaining some embodiments of the present embodiment, a technique common to each of the embodiments will be first described.

A peaking control circuit according to the present embodiment is used in an interface circuit through which data is input or output, a clock distribution circuit and the like in an LSI and the like configuring a data transmitting equipment. Particularly, a peaking state of a signal wave form is controlled by using an inductor peaking circuit as a base and by varying a circuit parameter.

Figure 1:
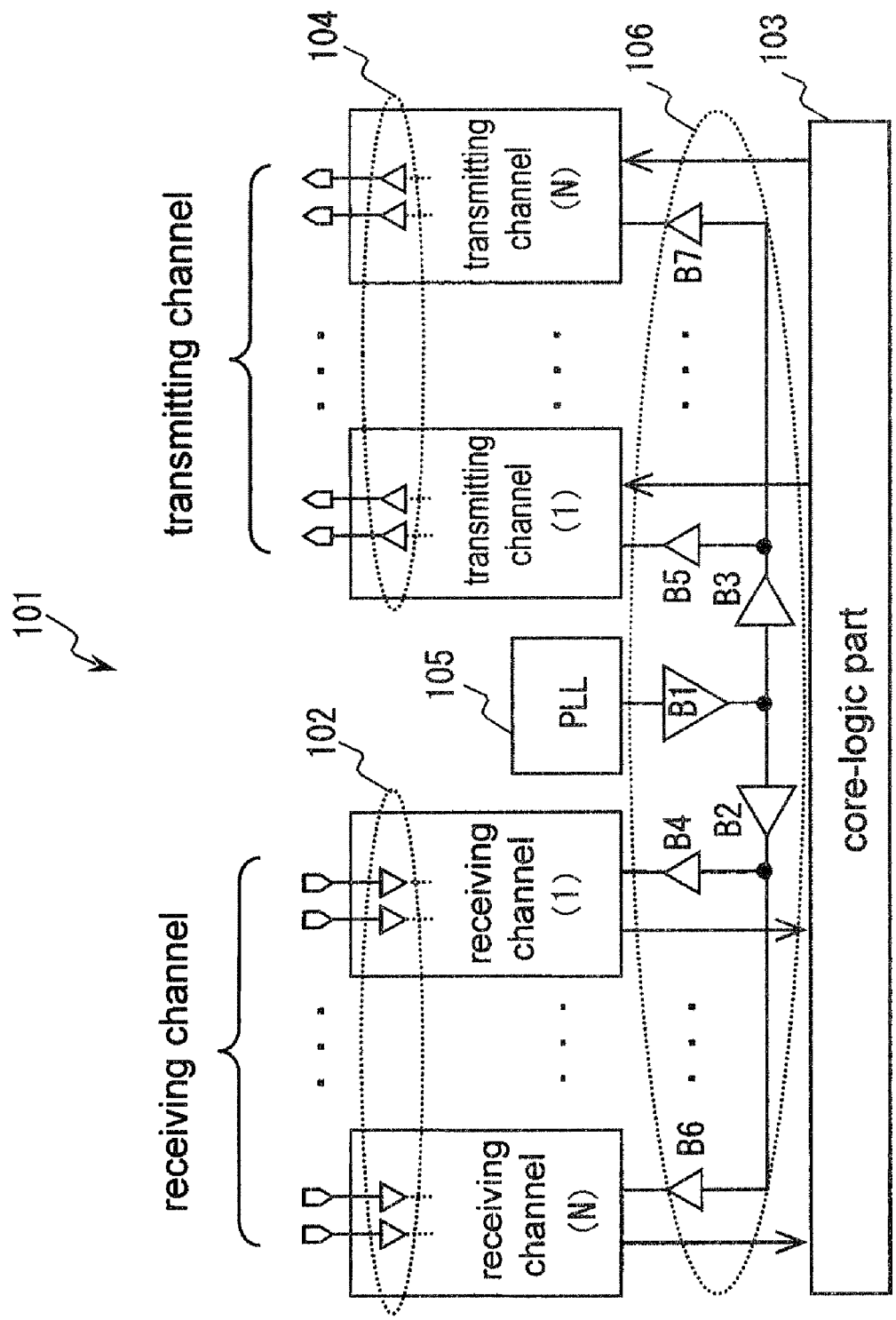
FIG. 1 illustrates a data transmission circuit applying a peaking control circuit according to the present embodiment.

FIG. 1 is a block diagram of an LSI for data transmission 101 such as a network switch. The LSI for data transmission 101 has N-number of receiving channels (1) through (N), and N-number of transmitting channels (1) through (N). To inlets of the N-number of receiving channels, there is provided an interface circuit 102 which receives data transmitted from a side of a network and outputs to a core-logic part 103. Further, to outlets of the N-number of transmitting channels, there is provided an interface circuit 104 which transmits the data generated by the core-logic part 103 to the side of the network.

Further, inside the LSI for data transmission 101, there is provided a PLL circuit 105 which generates clocks to be supplied in the LSI. The generated clocks are supplied to the N-number of receiving channels (1) through (N) and the N-number of transmitting channels (1) through (N) via a clock distribution circuit 106 configured by buffers B1 through B7.

The peaking control circuit according to the present embodiment is used in the interface circuit 102 at a receiving side, the interface circuit 104 at a transmitting side, the clock distribution circuit 106 or the like.

Hereinafter, embodiments of the peaking control circuit applied to the interface circuits 102 and 104 and the clock distribution circuit 106 will be described.

Figure 2:
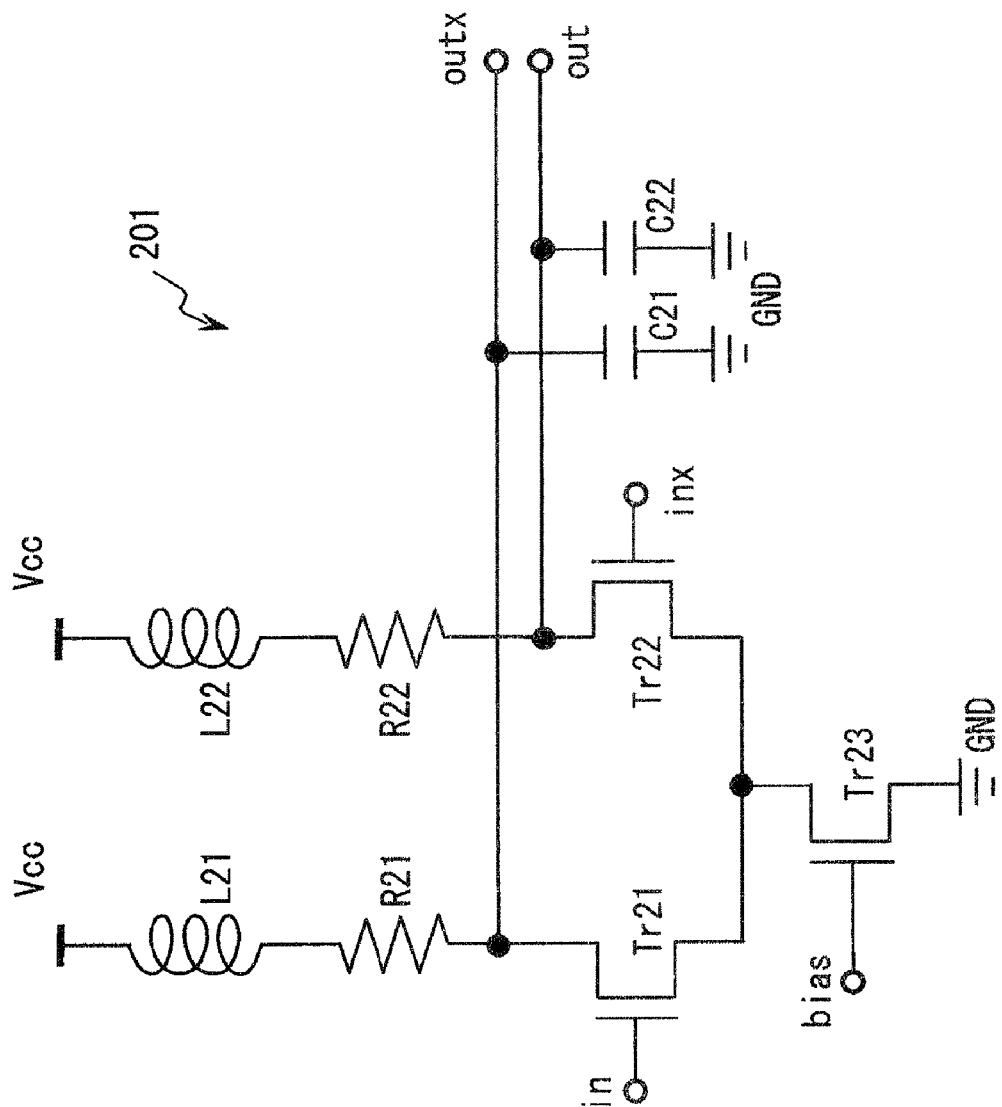
FIG. 2 illustrates an inductor peaking circuit.

An inductor peaking circuit 201 to be a base of the present embodiment is shown in FIG. 2. The inductor peaking circuit 201 has a circuit of a differential amplifier as a base, and has a complementary input signal formed of a non-inverted input signal in and an inverted input signal inx and a complementary output signal formed of a non-inverted output signal out and an inverted output signal outx.

The non-inverted input signal in is input into a gate of an nMOS type transistor Tr21. A source of the transistor Tr21 is coupled to a power supply (Vcc) via a resistor R21 and an inductor L21, and outputs the inverted output signal outx formed by inverting the non-inverted input signal in.

In like manner, a source of an nMOS type transistor Tr22 is coupled to the power supply (Vcc) via a resistor R22 and an inductor L22, and outputs the non-inverted output signal out formed by inverting the inverted input signal inx input into a gate of the transistor Tr22.

Further, drains of the transistors Tr21 and Tr22 are earthed (GRD) via an nMOS type transistor Tr23, and by a bias voltage applied to a gate of the transistor Tr23, a bias current which flows into the transistors Tr21 and Tr22 is controlled.

Further, capacitors C22 and C21 which form output capacitances are respectively coupled between the non-inverted output signal out and the GND, and between the inverted output signal outx and the GND.

The non-inverted input signal in and the inverted input signal inx forming the complementary input signal are corrected by a circuit characteristic determined by the inductors L21 and L22, the resistors R21 and R22, and the capacitors C21 and C22, and are output as the non-inverted output signal out and the inverted output signal outx forming the complementary output signal.

Figure 3:
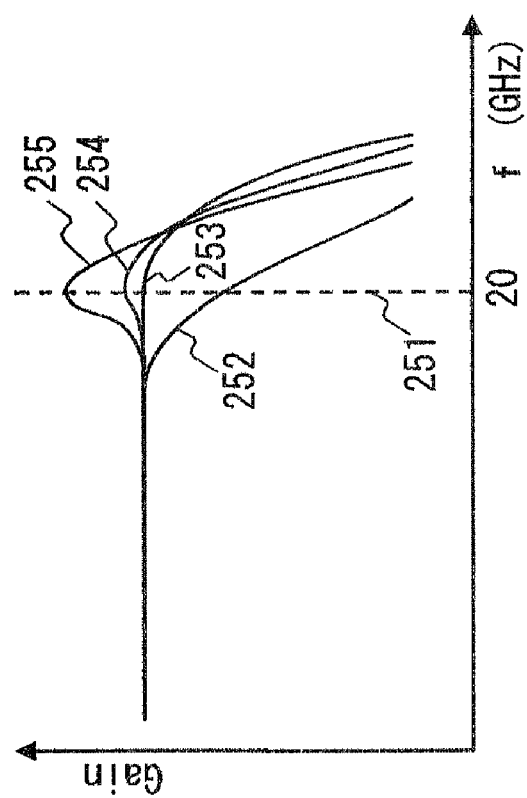
FIG. 3 illustrates a characteristic of the inductor peaking circuit.

Here, the circuit characteristic of the inductor peaking circuit 201 will be explained. The inductor peaking circuit 201 can have a circuit characteristic as shown in FIG. 3 by a combination of constants of the inductors L21 and L22, the resistors R21 and R22, and the capacitors C21 and C22. In the same drawing, a horizontal axis indicates a frequency (GHz), and a vertical axis indicates a gain. For instance, when a bit rate of a signal of an NRZ method passing through the inductor peaking circuit 201 is 40 Gbps, a frequency component of the signal extends in the vicinity of 20 GHz as a center shown by a dotted line 251. At this time, when a frequency characteristic of the inductor peaking circuit 201 takes a characteristic shown by a curved line 252, since the signal is largely attenuated in the vicinity of 20 GHz, a signal wave form becomes obtuse. When the signal wave form becomes obtuse, a data error may be generated in the worst case.

For this reason, when designing the LSI for data transmission 101, the constants of the inductors L21 and L22, the resistors R21 and R22, and the capacitors C21 and C22 are designed so that the characteristic is indicated by a curved line 253 showing an ideal characteristic. However, the peaking state is changed due to a variation when manufacturing a semiconductor or a change in a temperature at the time of usage or the like, and a result of this, a peaking shown by a curved line 254 is generated. In the worst case, a very large peaking shown by a curved line 255 appears, resulting that a quality of a signal to transmit significantly deteriorates.

Figure 4:
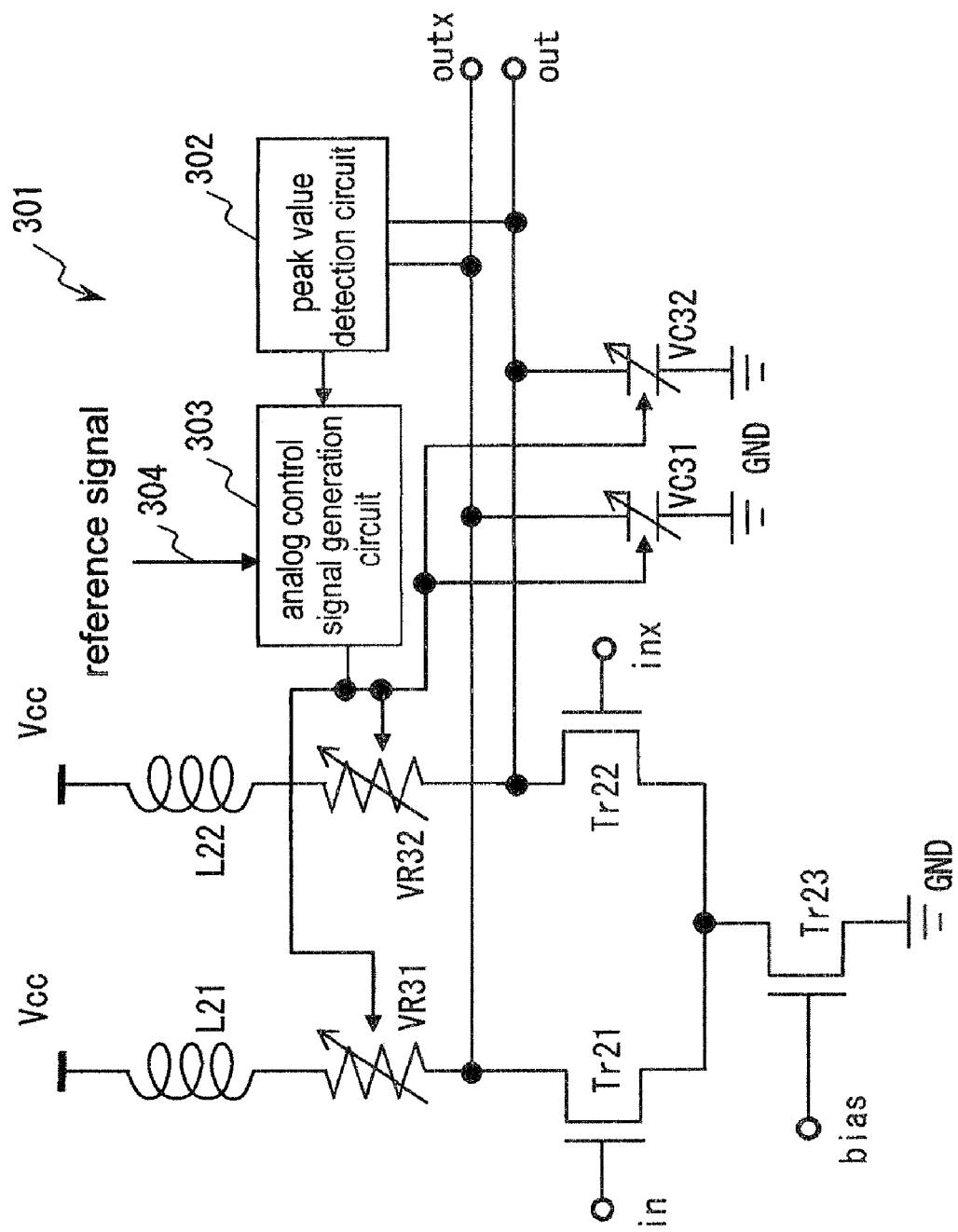
FIG. 4 illustrates a peaking control circuit according to first and second embodiments.

Accordingly, a peaking control circuit 301 according to the present embodiment shown in FIG. 4 enables to vary the circuit characteristic after manufacturing the LSI or during an operation of the LSI, to thereby make it possible to stably conduct a peaking control even when a variation at the time of manufacture exists or a usage environment of the LSI such as a temperature changes. Note that in FIG. 4, the elements denoted by the same reference numerals as in FIG. 2 indicate the same elements, so that an explanation thereof will be omitted. Variable resistances VR 31 and VR 32 are provided instead of the resistors R21 and R22 in FIG. 2, and variable capacitors VC31 and VC32 are provided instead of the capacitors C21 and C22 in FIG. 2. Further, a peak value detection circuit 302 and an analog control signal generation circuit 303 are provided. The peak value detection circuit 302 detects a peak value of the non-inverted output signal out and the inverted output signal outx forming the complementary output signal and outputs to the analog control signal generation circuit 303. The analog control signal generation circuit 303 generates a control signal of an analog voltage by comparing the peak value detected by the peak value detection circuit 302 with a value of a reference signal 304 being previously set, and outputs to the variable resistances VR31 and VR32, and the variable capacitors VC31 and VC32.

Figure 5:
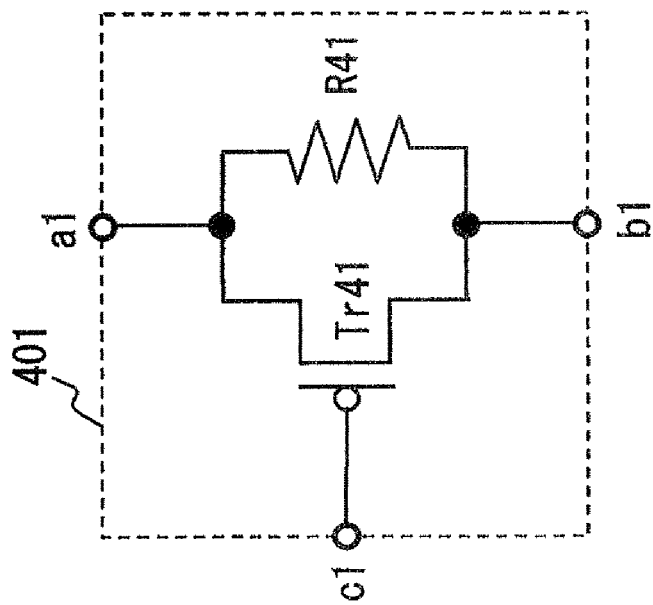
FIG. 5 illustrates a configuration example of a variable resistance.
Figure 5:
Figure 5:
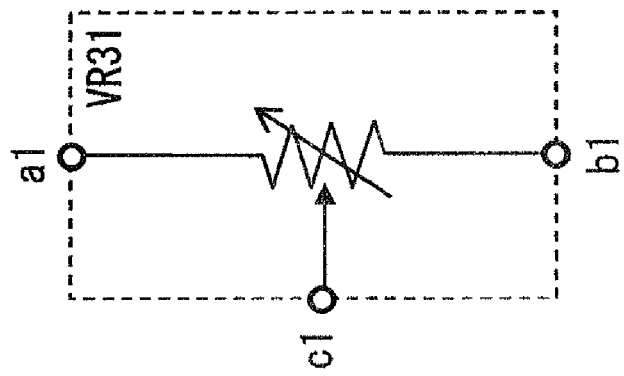

Here, a circuit example of the variable resistance VR31 is shown in FIG. 5. Note that the variable resistance VR32 can also be realized by the same circuit. If terminals and a control terminal of the variable resistance VR31 are respectively set as a1 and b1, and c1, the variable resistance VR31 can be configured as a variable resistance circuit 401. In the variable resistance circuit 401, a source and a drain of a pMOS type transistor Tr41 are coupled in parallel between the a1 and the b1 of a resistor R41. If a gate voltage of the transistor Tr41 coupled to the control terminal c1 is varied, a resistance value between the source and the drain of the transistor Tr41 is changed, resulting that a resistance value between the a1 and the b1 of the resistor R41 is also changed. For instance, if a voltage applied to the control terminal c1 is increased, the resistance value between the source and the drain of the transistor Tr41 becomes small, so that the resistance value between the a1 and the b1 is lowered. On the contrary, if the voltage applied to the control terminal c1 is decreased, the resistance value between the source and the drain of the transistor Tr41 becomes large, so that the resistance value between the a1 and the b1 is increased. As above, the variable resistances VR31 and VR32 can be configured in the LSI.

Figure 6:
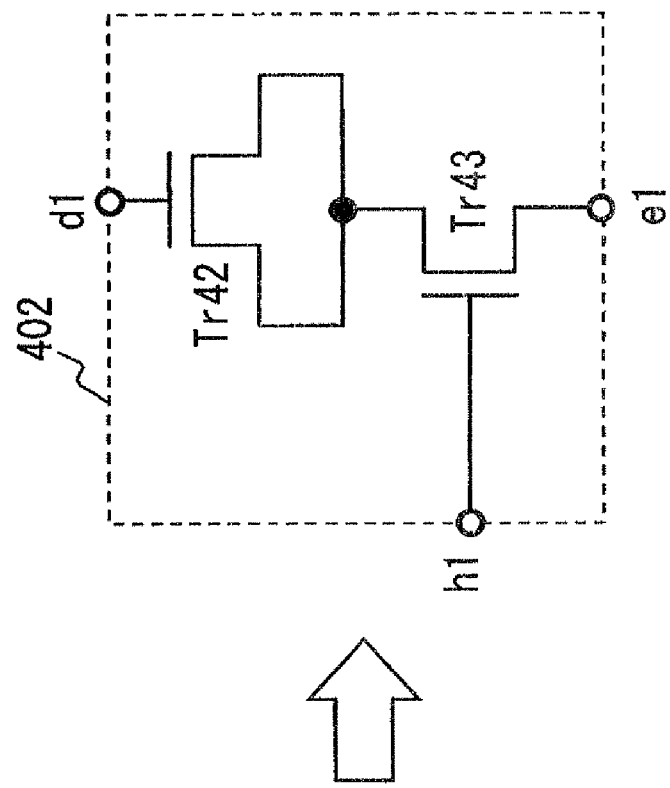
FIG. 6 illustrates a configuration example of a variable capacitor.
Figure 6:
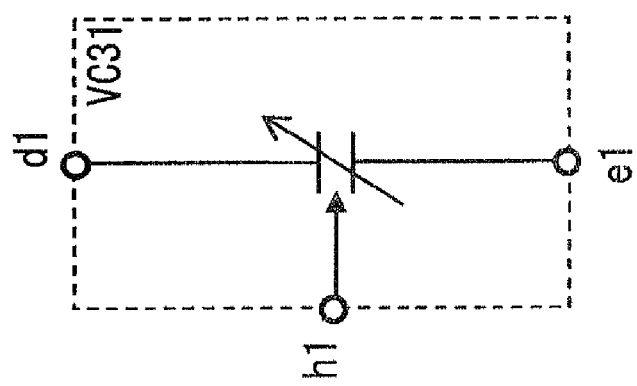

Next, a circuit example of the variable capacitors VC31 and VC32 is shown in FIG. 6.

If terminals and a control terminal of the variable capacitor VC31 are respectively set as d1 and e1, and h1, the variable capacitor VC31 can be configured as a variable capacitance circuit 402. The variable capacitance circuit 402 is configured by two transistors formed of nMOS type transistors Tr42 and Tr43. A gate of the transistor Tr42 is set as the terminal d1, and a source and a drain are coupled. The source and the drain of the transistor Tr42 are coupled to a source of the transistor Tr43, and a drain of the transistor Tr43 is set as the terminal e1. If a gate voltage of the transistor Tr43 is varied from the control terminal d1, under this state, a voltage applied to the source and the drain of the transistor Tr42 is changed, resulting that a capacitance with respect to the gate of the transistor Tr42 is also changed. As above, the variable capacitors VC31 and VC32 can be configured in the LSI.

Figure 7:
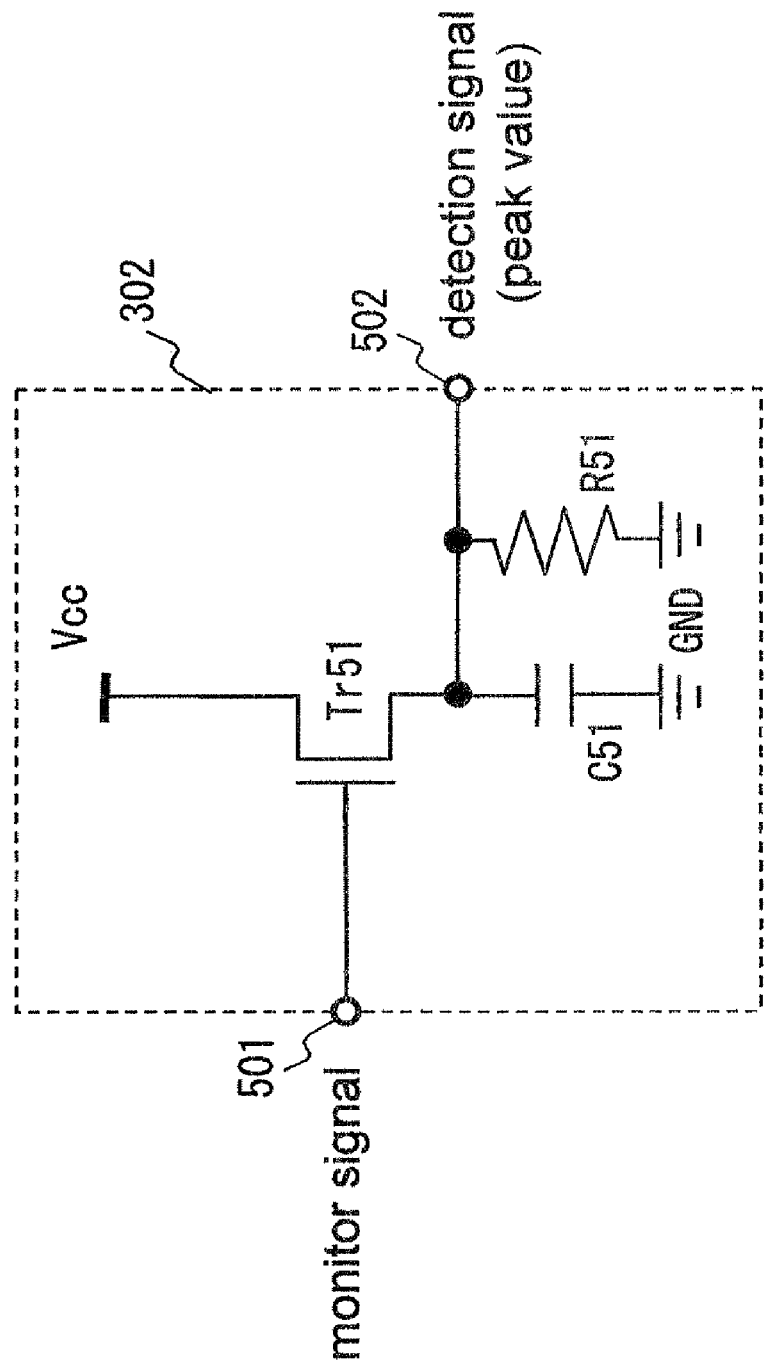
FIG. 7 illustrates an example of a peak value detection circuit.

Next, a circuit example of the peak detection circuit 302 in FIG. 4 is shown in FIG. 7. The peak detection circuit 302 can be formed of, for example, an nMOS type transistor Tr51, a resistor R51 and a capacitor C51. A source of the transistor Tr5 is coupled to the Vcc, and a signal 502 is output from a drain. Further, the capacitor C51 and the resistor R51 coupled in parallel are coupled between the drain and the GND.

A monitor signal 501 of the non-inverted output signal out or the inverted output signal outx in FIG. 4 is input into a gate of the transistor Tr51, and a voltage according to a voltage of the monitor signal 501 is held in the capacitor C51. Here, if the monitor signal 501 having a voltage lower than the voltage held in the capacitor C51 is input, since it does not affect the held voltage of the capacitor C51, a detection signal 502 in which the held voltage of the capacitor C51 is set as a peak value without change is output.

As described above, the peak detection circuit 302 can hold the peak voltage of the monitor signal 501 in the capacitor C51, and output the peak voltage as the detection signal 502. Note that the capacitor C51 and the resistor R51 are coupled in parallel, so that the held voltage of the capacitor C51 is discharged via the resistor R51 after a certain period of time which is determined based on a time constant determined by the capacitor C51 and the resistor R51. By setting the time constant determined by the capacitor C51 and the resistor R51 as a time interval during which the peaking is controlled, it is possible to detect a peak voltage according to a signal which flows into the interface circuit. Note that the peak detection circuit 302 detects the peak voltage of each of the non-inverted output signal out and the inverted output signal outx shown in FIG. 4, and outputs to the analog control signal generation circuit 303. Here, regarding the respective peak voltages of the non-inverted output signal out and the inverted output signal outx, a value in which both peak voltages are added may be set as a peak value, or a value of either of the peak voltages may be set as the peak value.

Figure 8:
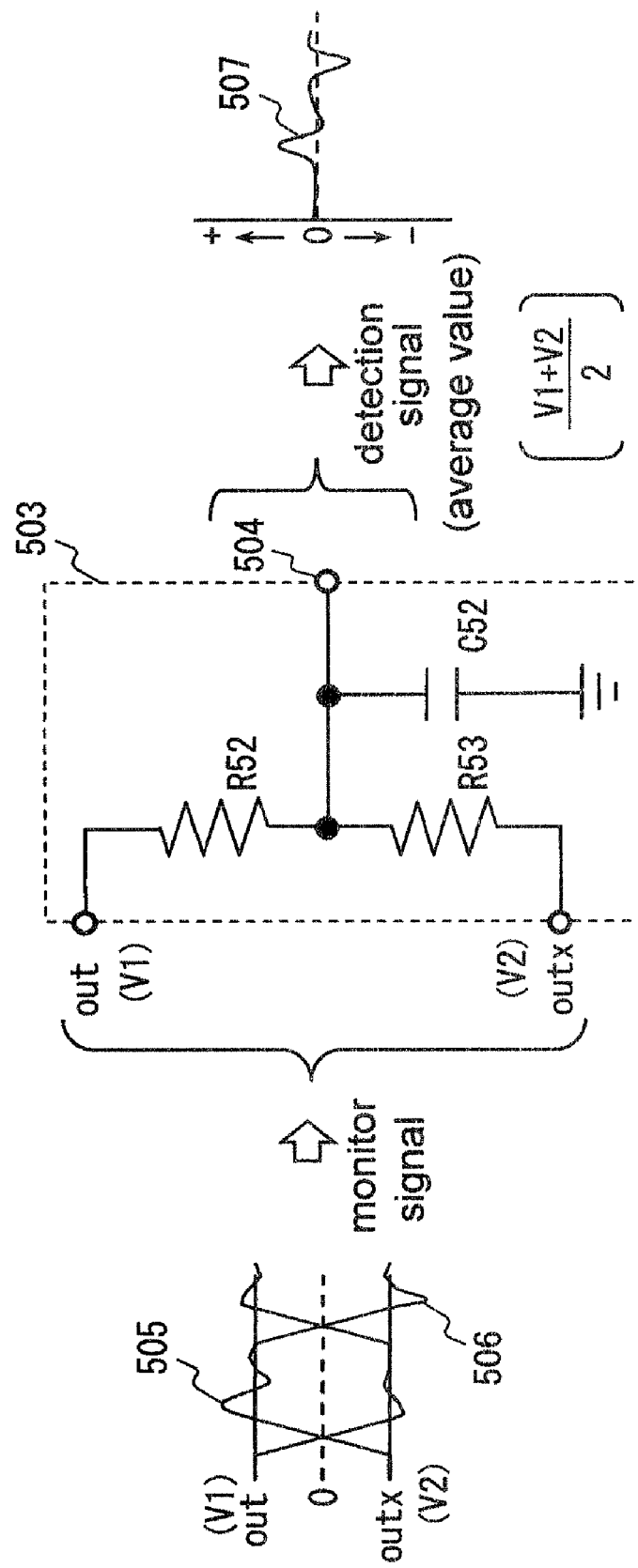
FIG. 8 illustrates an example of an average value detection circuit.

Alternatively, instead of the peak detection circuit 302, it may be configured as an average value detection circuit 503 as shown in FIG. 8. The average value detection circuit 503 can be formed of resistors R52 and R53 which divide a voltage of the non-inverted output signal out and the inverted output signal outx shown in FIG. 4, and a capacitor C52 which stabilizes an output voltage. An average voltage obtained by dividing the voltage of the non-inverted output signal out and the inverted output signal outx by the resistors R52 and R53 is output as a detection signal 504.

Here, the non-inverted output signal out and the inverted output signal outx forming the complementary signal show a symmetric signal wave form, so that an average value of the detection signal 504 normally becomes zero. However, when the peaking becomes large, the symmetry becomes unbalanced. For instance, if a peaking point 505 larger than the inverted output signal outx appears in the non-inverted output signal out, the average value goes to a positive side, resulting that the detection signal 504 also goes to the positive side. On the contrary, if a peaking point 506 larger than the non-inverted output signal out appears in the inverted output signal outx, the average value goes to a negative side, resulting that the detection signal 504 also goes to the negative side.

As above, the peak voltage of the non-inverted output signal out and the inverted output signal outx shown in FIG. 4 can be detected. Note that it is allowable that an absolute value of the detection signal 504 of the average value detection circuit 503 is obtained, and the peak voltage is output as a positive voltage value.

Figure 9:
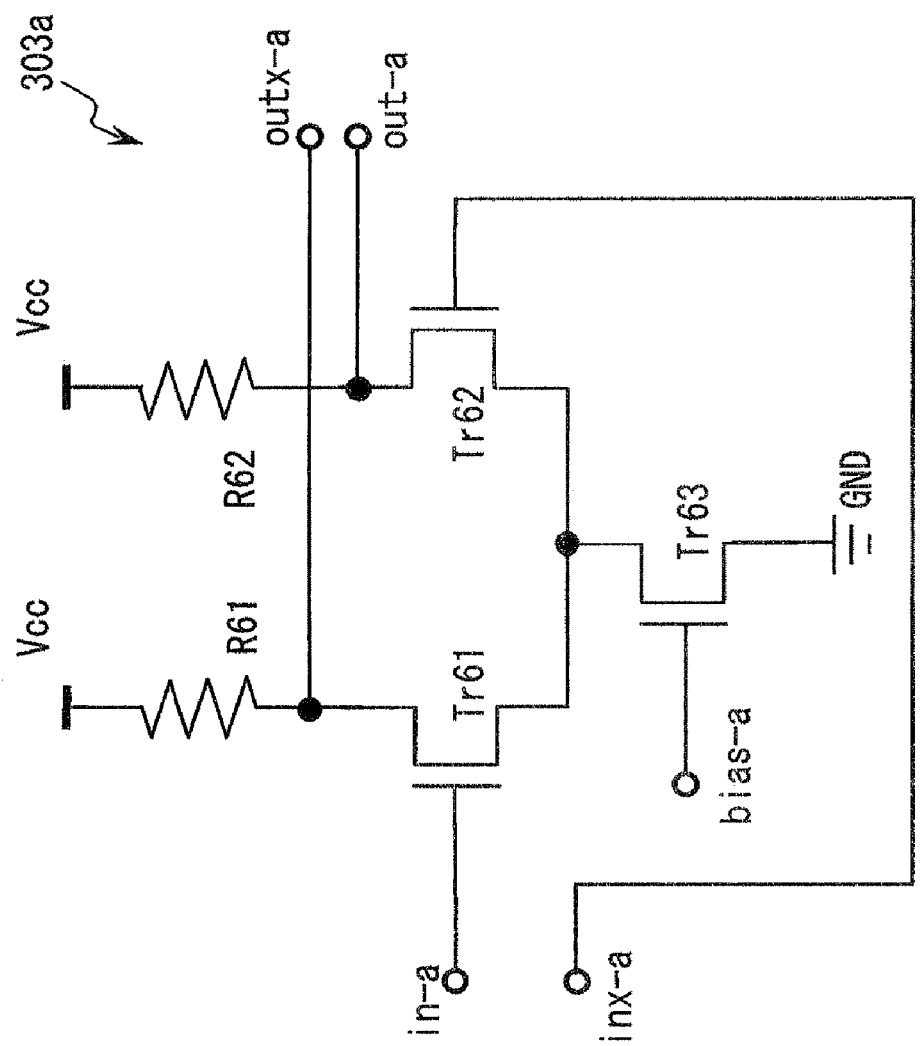
FIG. 9 is a circuit diagram of an analog control signal generation circuit in the peaking control circuit according to the first embodiment.

Next, as an example of a circuit of the analog control signal generation circuit 303 shown in FIG. 4, a circuit diagram of an analog control signal generation circuit 303a is shown in FIG. 9. The analog control signal generation circuit 303a is formed of resistors R61 and R62, and nMOS type transistors Tr61, Tr62 and Tr63.

In the analog control signal generation circuit 303a, sources of the transistors Tr61 and Tr62 are coupled to the Vcc respectively via the resistors R61 and R62. Further, drains of the transistors Tr61 and Tr62 are coupled to a source of the transistor Tr63, and a bias current which flows into the drain earthed to the GND is varied by a gate voltage bias-a. As above, the analog control signal generation circuit 303a forms a differential amplifier circuit which outputs a difference between a non-inverted input signal in_a and an inverted input signal inx_a to the non-inverted output signal out and the inverted output signal outx.

Here, the peak voltage output from the peak detection circuit 302 is input into the non-inverted input signal in_a, and a reference voltage set from an exterior is input into the inverted input signal inx_a. At this time, when the peak voltage is higher than the reference voltage, a positive differential voltage and a negative differential voltage are respectively output to the non-inverted output signal out and the inverted output signal outx. On the contrary, when the peak voltage is lower than the reference voltage, the negative differential voltage and the positive differential voltage are respectively output to the non-inverted output signal out and the inverted output signal outx.

Now, if the analog control signal generation circuit 303 in FIG. 4 is configured so that the non-inverted output signal out equals to the output of the analog control signal generation circuit 303a, the non-inverted output signal out is input as a control signal of the variable resistances VR31 and VR32, and the variable capacitors VC31 and VC32. For instance, when the variable resistances VR31 and VR32 are configured as shown in FIG. 5, if an output voltage of the non-inverted output signal out becomes positively large, the resistance values of the variable resistances VR31 and VR32 become small. Further, when the variable capacitors VC31 and VC32 are configured as shown in FIG. 6, if the output voltage of the non-inverted output signal out becomes positively large, the capacitances of the variable capacitors VC31 and VC32 become small. In other words, if the resistance values of the variable resistances VR31 and VR32 are lowered in the circuit in FIG. 4, the current which flows into the transistors Tr21 and Tr22 is increased, resulting that the peaking is increased, but a frequency band becomes wide. In like manner, if the capacitance values of the variable capacitors VC31 and VC32 are lowered, a load capacitance is decreased, resulting that a peak of the peaking becomes high, but the frequency band becomes wide. On the contrary, when the output voltage of the non-inverted output signal out becomes negatively large, the resistance values of the variable resistances VR31 and VR32 and the capacitance values of the variable capacitors VC31 and VC32 become large, resulting that the peak of the peaking is lowered, and the frequency band becomes narrow.

As described above, when the peak of the peaking becomes high, the output of the peak detection circuit 302 is increased. When the output of the peak detection circuit 302 becomes larger than the reference voltage previously set in the analog control signal generation circuit 303, the resistance values of the variable resistances VR31 and VR32 and the capacitance values of the variable capacitors VC31 and VC32 become large, resulting that the peak of the peaking can be kept low. On the contrary, when the peak of the peaking is lowered, the output of the peak detection circuit 302 is decreased. When the output of the peak detection circuit 302 becomes smaller than the reference voltage set in the analog control signal generation circuit 303, the resistance values of the variable resistances VR31 and VR32 and the capacitance values of the variable capacitors VC31 and VC32 become small, resulting that the characteristic has a tendency in which the peak of the peaking becomes higher. In other words, it is possible to automatically control so that the output of the peak detection circuit 302 equals to the reference voltage set in the analog control signal generation circuit 303. As a result of this, it becomes possible to freely control the state of the peaking by varying the reference voltage set in the analog control signal generation circuit 303 after the LSI is manufactured and the analog control signal generation circuit 303 is built in the circuit and device.

Figure 10:
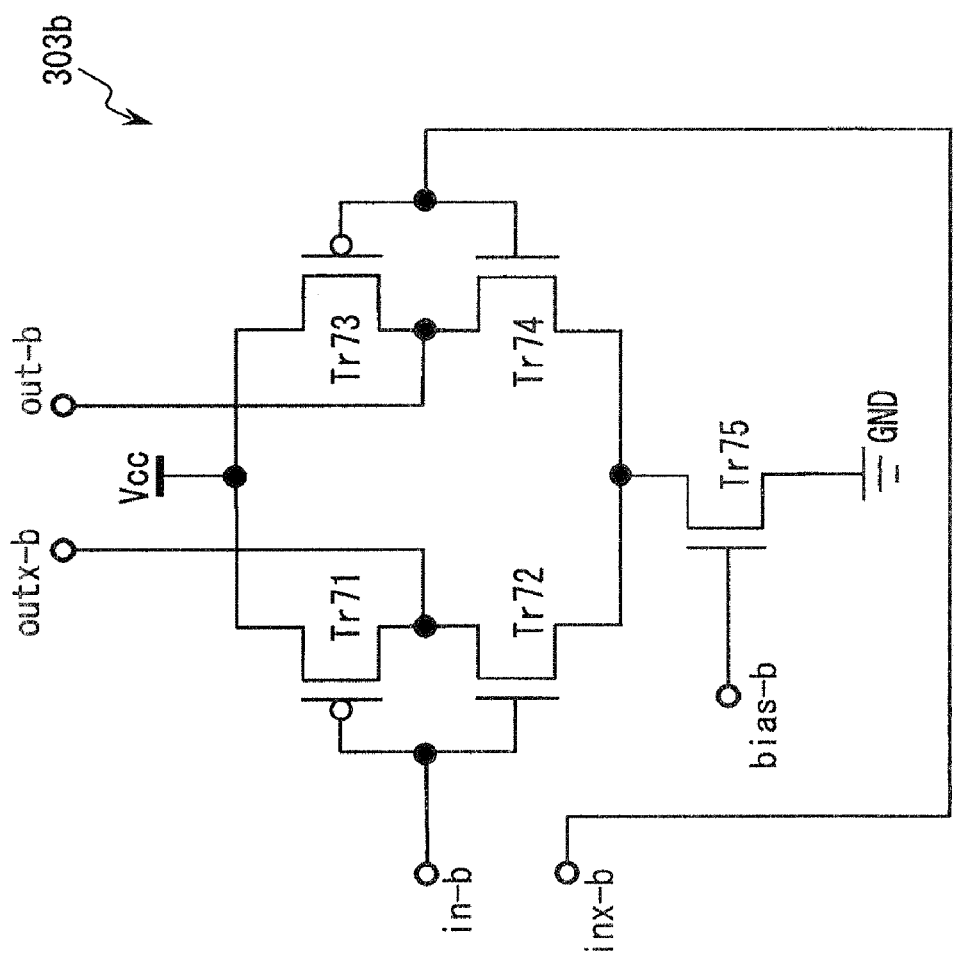
FIG. 10 illustrates an analog control signal generation circuit in the peaking control circuit according to the second embodiment.

Next, a peaking control circuit according to a second embodiment will be described. The peaking control circuit of the present embodiment has the same configuration as that of the peaking control circuit 301 of the first embodiment shown in FIG. 4. What is different from the first embodiment is a configuration of the analog control signal generation circuit 303, and a circuit diagram of an analog control signal generation circuit 303b of the present embodiment is shown in FIG. 10.

The analog control signal generation circuit 303b is configured by two inverters respectively formed of a pair of nMOS type transistor Tr71 and pMOS type transistor Tr72 and a pair of nMOS type transistor Tr73 and pMOS type transistor Tr74, and an nMOS type transistor Tr75 varying bias currents of the two inverters.

A non-inverted input signal in_b is input into gates of the transistors Tr71 and Tr72, and an inverted output signal outx_b is output from a coupling point between a drain of the transistor Tr71 and a source of the transistor Tr72. An inverted input signal inx_b is input into gates of the transistors Tr73 and Tr74, and a non-inverted output signal out_b formed by reinverting the inverted input signal inx_b is output from a coupling point between a drain of the transistor Tr73 and a source of the transistor Tr74. Here, the peak voltage of the peak detection circuit 302 is input into the non-inverted input signal in_b, and the reference voltage is input into the inverted input signal inx_b. At this time, when the peak voltage is higher than the reference voltage, a positive differential voltage and a negative differential voltage are respectively output to the non-inverted output signal out_b and the inverted output signal outx_b. On the contrary, when the peak voltage is lower than the reference voltage, the negative differential voltage and the positive differential voltage are respectively output to the non-inverted output signal out_b and the inverted output signal outx_b.

Now, if the analog control signal generation circuit 303 in FIG. 4 is configured so that the non-inverted output signal out_b equals to the output of the analog control signal generation circuit 303b, the non-inverted output signal out_b is input as a control signal of the variable resistances VR31 and VR32, and the variable capacitors VC31 and VC32. In this case, if the resistance values of the variable resistances VR31 and VR32 are lowered similarly as in the analog control signal generation circuit 303a of the first embodiment, the current which flows into the transistors Tr21 and Tr22 is increased, resulting that the peak of the peaking becomes high, but a frequency band is increased to a high frequency. In like manner, if the capacitance values of the variable capacitors VC31 and VC32 are lowered, the load capacitance is decreased, resulting that the peak of the peaking becomes high, but the frequency band becomes wide. On the contrary, when the output voltage of the non-inverted output signal out_b becomes negatively large, the resistance values of the variable resistances VR31 and VR32 and the capacitance values of the variable capacitors VC31 and VC32 become large, resulting that the peak of the peaking is lowered, and the frequency band becomes narrow.

As described above, when the peak of the peaking becomes high, the peak voltage of the peak detection circuit 302 is increased. When the peak voltage of the peak detection circuit 302 becomes larger than the reference voltage previously set in the analog control signal generation circuit 303, the resistance values of the variable resistances VR31 and VR32 and the capacitance values of the variable capacitors VC31 and VC32 become large, resulting that the peak of the peaking can be kept iow. On the contrary, when the peak of the peaking is lowered, the peak voltage of the peak detection circuit 302 is decreased. When the peak voltage of the peak detection circuit 302 becomes smaller than the reference voltage set in the analog control signal generation circuit 303, the resistance values of the variable resistances VR31 and VR32 and the capacitance values of the variable capacitors VC31 and VC32 become small, resulting that the characteristic has a tendency in which the peak of the peaking becomes higher. In other words, it is possible to automatically control so that the peak voltage of the peak detection circuit 302 equals to the reference voltage set in the analog control signal generation circuit 303. As a result of this, it becomes possible to freely control the state of the peaking by varying the reference voltage set in the analog control signal generation circuit 303 after the LSI is manufactured and the analog control signal generation circuit 303 is built in the circuit and device.

Figure 11:
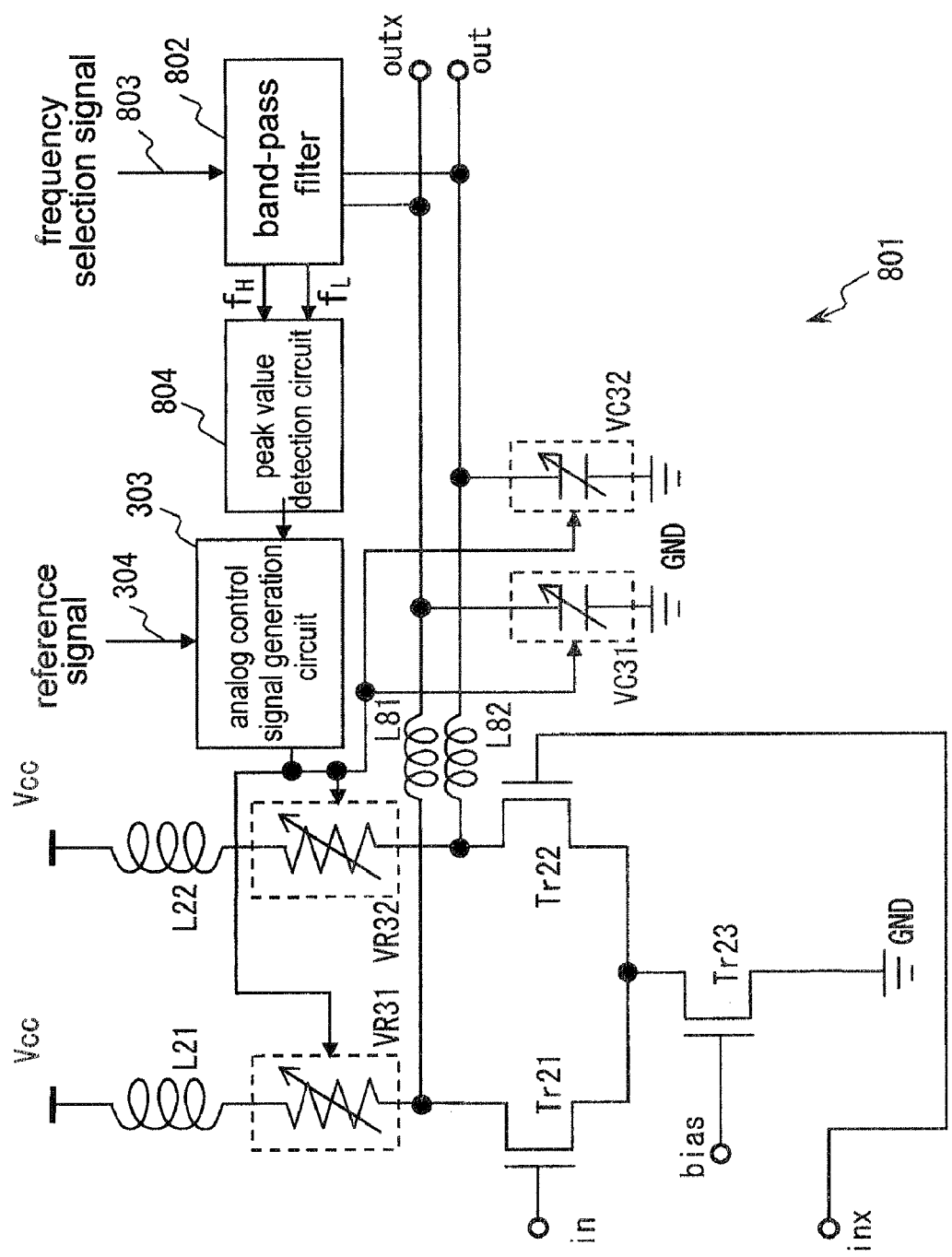
FIG. 11 illustrates a peaking control circuit according to a third embodiment.

Next, a peaking control circuit 801 according to a third embodiment will be explained using FIG. 11. In the peaking control circuit 801, there are provided not only the inductors L21 and L22 but also an inductor LSI inserted between the source of the transistor Tr21 and the inverted output signal outx and an inductor L82 inserted between the source of the transistor Tr22 and the non-inverted output signal out. As above, by providing the inductors on a plurality of places, a finer adjustment of the circuit characteristic can be realized. In the circuit of FIG. 11, the inductors are inserted into two places, which creates three resonance points of the peaking.

Figure 12:
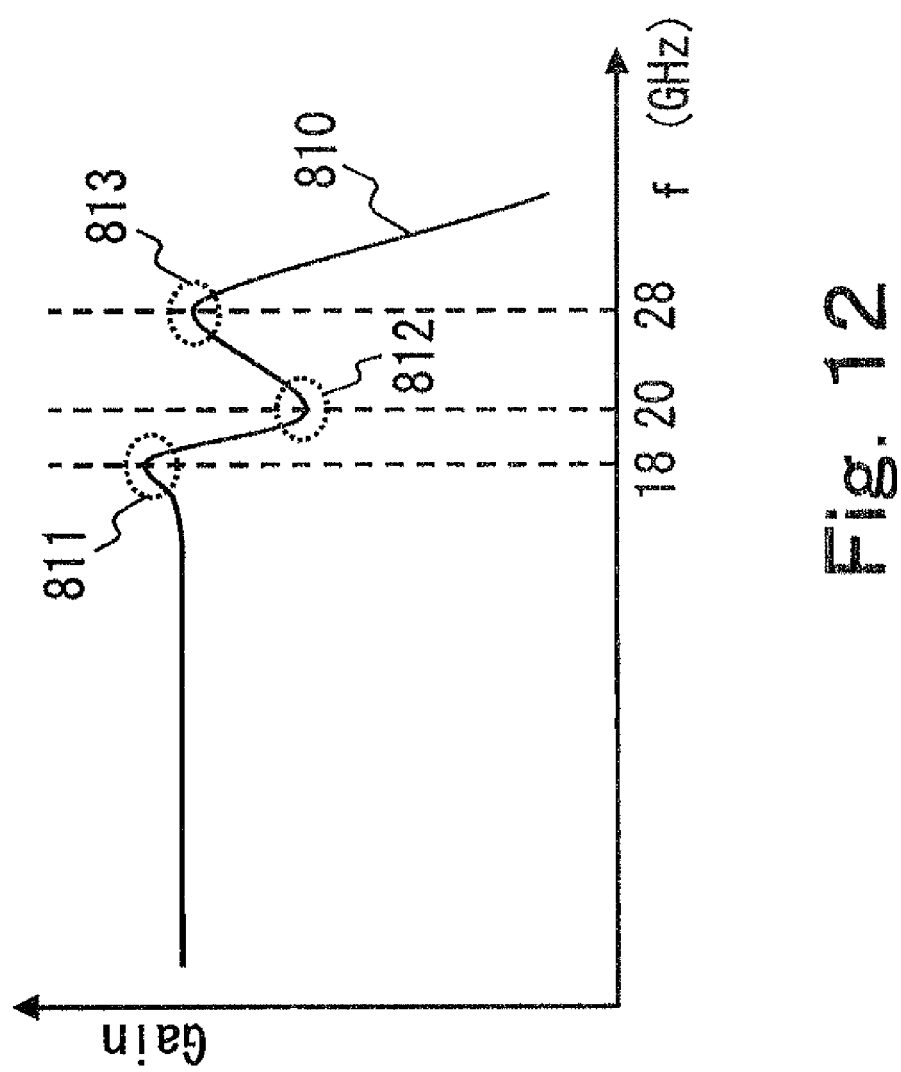
FIG. 12 illustrates a characteristic example when a plurality of peakings exist.

For instance, a frequency characteristic between the non-inverted input signal in and the inverted input signal inx and the non-inverted output signal out and the inverted output signal outx in FIG. 11 can be indicated by a curved line 810 in FIG. 12. In the same drawing, a horizontal axis indicates a frequency (GHz), and a vertical axis indicates a gain. In an order from the lowest frequency in the curved line 810, a first peak of the peaking indicated by a dotted line circle 811 appears in the vicinity of 18 GHz, a trough of the peaking indicated by a dotted line circle 812 appears in the vicinity of 20 GHz, and the third peak of the peaking indicated by a dotted line circle 813 appears in the vicinity of 28 GHz. As above, the three resonance points realize a complicated frequency characteristic. For instance, if the frequency characteristic of a circuit which uses an NRZ signal of 40 Gbps is needed to be improved up to around 28 GHz, when the inductor is provided on only one place as in the circuit in FIG. 4, only one peak of the peaking appears, so that normally, a large peak of the peaking is made to appear in the vicinity of 20 GHz being a center of the signal of 40 Gbps. However, when the peak of the peaking is enlarged, although the band becomes wide, the signal wave form is largely distorted, which is unfavorable.

However, since the inductors are provided on two places in the peaking control circuit 801 of the present embodiment, by making small peaks of the peaking appear in the vicinity of 18 GHz and in the vicinity of 28 GHz as shown in FIG. 12, it is possible to obtain a characteristic in which a transmission can be realized up to the band in the vicinity of 28 GHz without extremely enlarging one peak of the peaking.

Meanwhile, since the peak values appear in a plurality of points, the detection of the peak values becomes difficult. Accordingly, instead of the peak value detection circuit 302 in FIG. 4, a peak value detection circuit 804 capable of detecting a plurality of peak values is provided. In the peak value detection circuit 804, signals of fH and fL of two frequency bands are input from a band-pass filter 802.

Here, the band-pass filter 802 has two band-pass filters, and characteristics of the two band-pass filters can be respectively varied by a frequency selection signal 803 given from the exterior. It is possible to set that, for example, signals in the vicinity of 18 GHz and in the vicinity of 28 GHz are passed in accordance with the frequency of the signal to control, and the signal of 18 GHz as a center and the signal of 28 GHz as a center are respectively set as the fL signal and the fH signal and output to the peak value detection circuit 804.

The peak value detection circuit 804 in which the signals of fL and fH of the two frequency bands are input from the band-pass filter 802 is configured by providing the peak value detection circuits 302 to the respective frequency bands of fL and fH. Specifically, the configuration can be realized by providing two systems of the circuit shown in FIG. 5.

Further, the peak value detection circuit 804 classifies the peaking states into five states such as, for example, excess (+2 points), little excess (+1 point), optimal (0 point), little deficient (−1 point), and deficient (−2 points), to thereby perform a weighting of the peak values of the two systems. After the weighting, additional values of evaluation points of the respective systems are output to the analog control signal generation circuit 303.

Further, the operation of the analog control signal generation circuit 303 is conducted in the same manner as in the first and second embodiments, in which the peaking state is controlled so that the value in which the peak values of the two systems are weighted and added equals to the reference voltage being previously set by varying the values of the variable resistances VR31 and VR32, the variable capacitors VC31 and VC32, or the like.

Note that for easier understanding, the number of places for inserting the inductors and the number of characteristics of the band-pass filter are set as two in the present embodiment, but, if these numbers are plural, the control can be conducted in the same manner.

Figure 13:
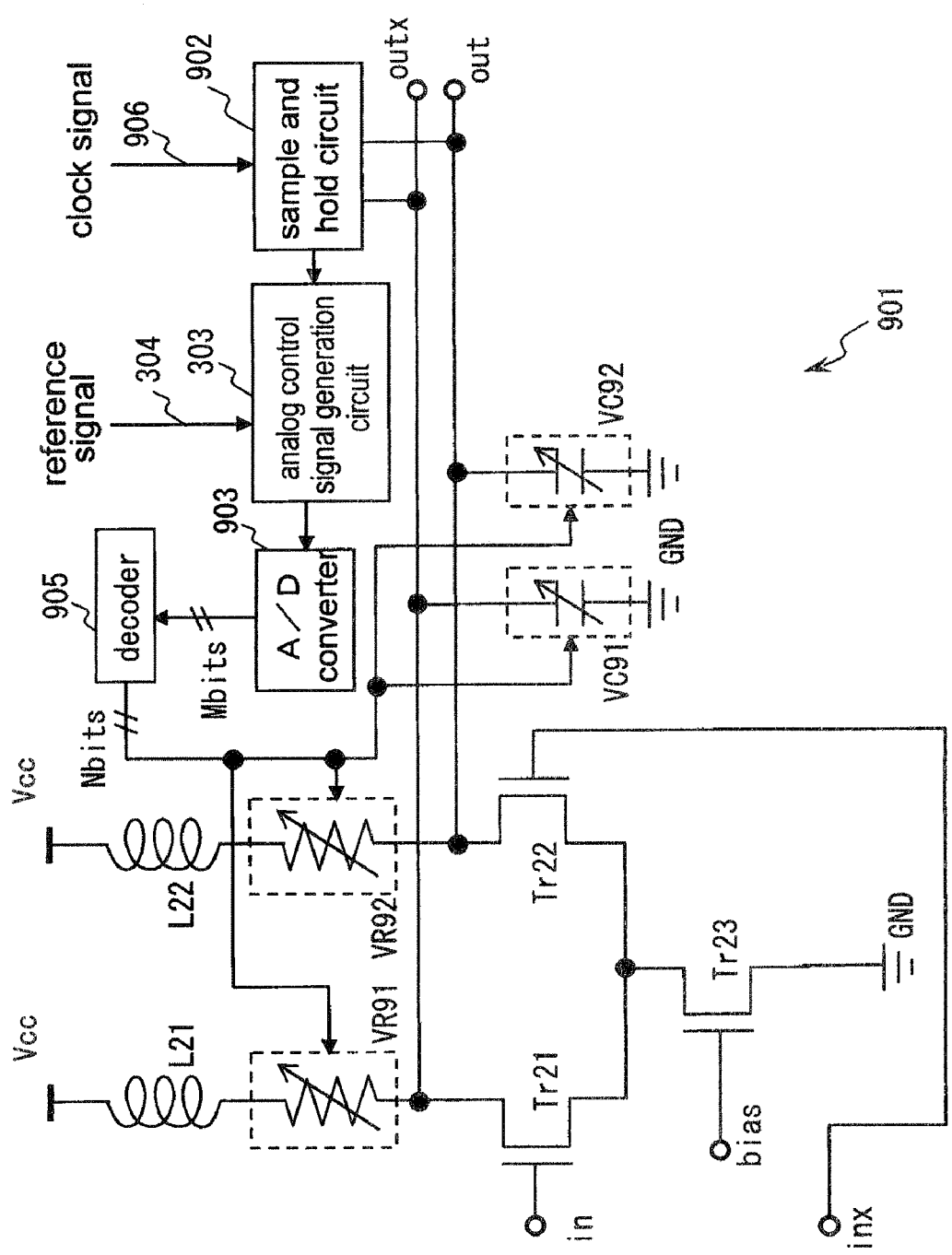
FIG. 13 illustrates a peaking control circuit according to a fourth embodiment.

A peaking control circuit 901 according to a fourth embodiment will be described using FIG. 13. The peaking control circuit 901 is formed of a sample and hold circuit 902, an A/D (analog-to-digital) converter 903, the analog control signal generation circuit 303 and a decoder 905. Further, the peaking control circuit 901 controls the variable resistances VR31 and VR32 and the variable capacitors VC31 and VC32 in FIG. 4 in a digital manner. Note that the elements denoted by the same reference numerals as in FIG. 4 indicate the same elements.

The sample and hold circuit 902 performs a sampling of a signal which flows into the non-inverted output signal out and the inverted output signal outx in synchronization with a clock signal 906 given from the exterior, and holds the sampled voltage value.

The A/D (analog-to-digital) converter 903 converts the output voltage of the analog control signal generation circuit 303 into M-bit digital data and outputs to the decoder 905.

The decoder 905 converts the M-bit digital data output from the A/D (analog-to-digital) converter 903 into N-bit digital data suitable for controlling digital variable resistors VR91 and VR92 and digital variable capacitors VC91 and VC92. Note that the digital variable resistors VR91 and VR92 and the digital variable capacitors VC91 and VC92 are different from the variable resistances VR31 and VR32 and the variable capacitors VC31 and VC32, and are configured so that they can be controlled in a digital manner.

Figure 14:
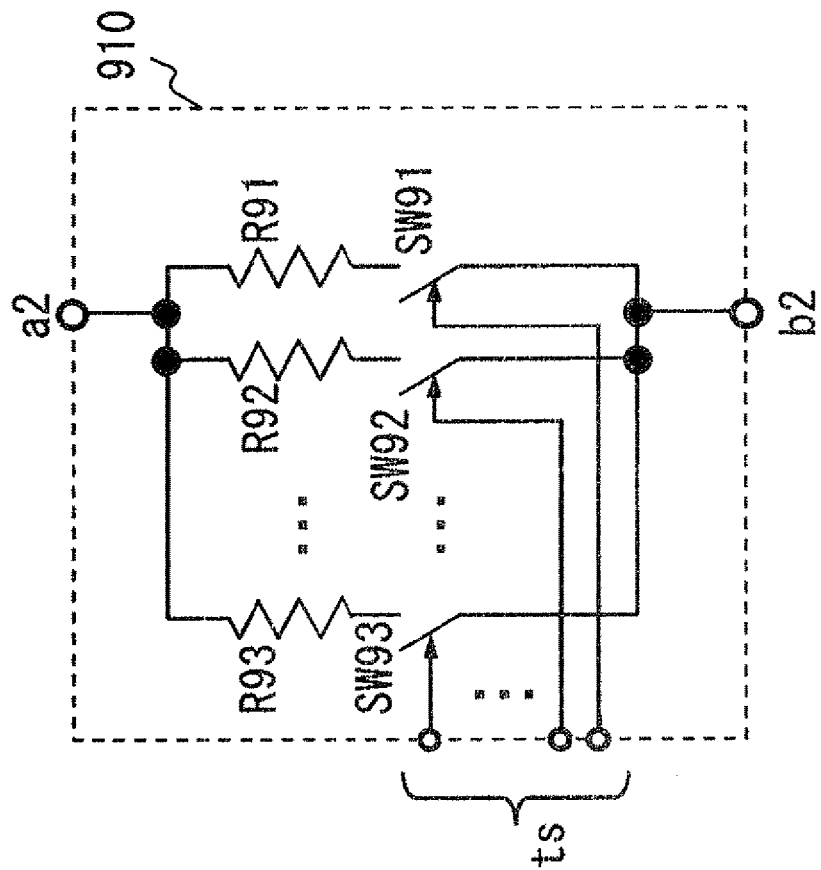
FIG. 14 illustrates a variable resistance configured in a digital manner.
Figure 14:
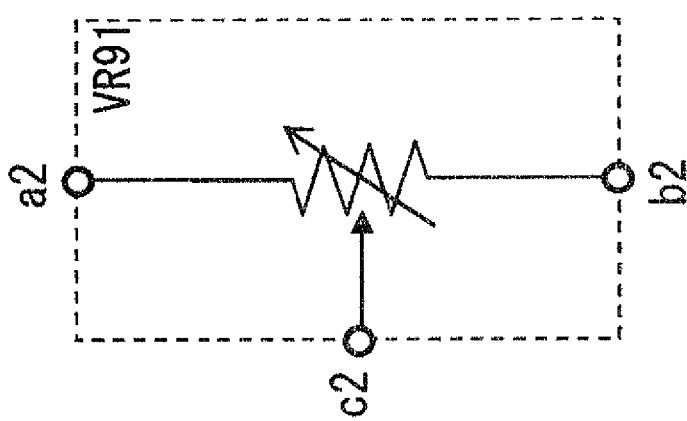

Here, a circuit configuration example of the digital variable resistor VR91 will be described using FIG. 14. If terminals and a control terminal of the digital variable resistor VR91 are respectively set as a2 and b2, and c2, the digital variable resistor VR91 can be configured as a digital variable resistor circuit 910, for example. Note that the digital variable resistor VR92 can also be realized by the same circuit.

In the digital variable resistor circuit 910, N-number of switches SW91 through SW93 are coupled in series with N-number of resistors R91 through R93 and are coupled in parallel between the terminals a2 and b2 of the digital variable resistor VR91. What corresponds to the control terminal c2 is N-bits control inputs which control on-off of the respective N-number of switches SW91 through 93. For instance, when the number of N-number of switches being turned on increases, the number of resistors coupled in parallel with the switches also increases, resulting that the resistance value between the terminals a2 and b2 is lowered. On the contrary, when the number of N-number of switches being turned off increases, the number of resistors coupled in parallel with the switches decreases, resulting that the resistance value between the terminals a2 and b2 is increased. As above, the resistance value can be varied in a digital manner.

The decoder 905 performs a logical operation so that the number of N-number of switches SW91 through 93 being turned on/off is changed in accordance with a value of the M-bit digital data output from the A/D (analog-to-digital) converter 903. For example, the logical operation is performed so that all of the N-number of switches are turned off when the value of the M-bit digital data output from the A/D (analog-to-digital) converter 903 takes a maximum value, and, on the contrary, all of the N-number of switches are turned on when the value of the M-bit digital data takes a minimum value. As a result of this, when the output of the analog control signal generation circuit 303 is large, namely, when the peak voltage held in the sample and hold circuit 902 is larger than the reference voltage of the analog control signal generation circuit 303, a lot of N-number of switches are turned off, which increases the resistance value, resulting that the control is conducted to lower the peak of the peaking. On the contrary, when the peak voltage held in the sample and hold circuit 902 is smaller than the reference voltage of the analog control signal generation circuit 303, a lot of N-number of switches are turned on, which decreases the resistance value, resulting that the control is conducted to enlarge the peak of the peaking.

Figure 15:
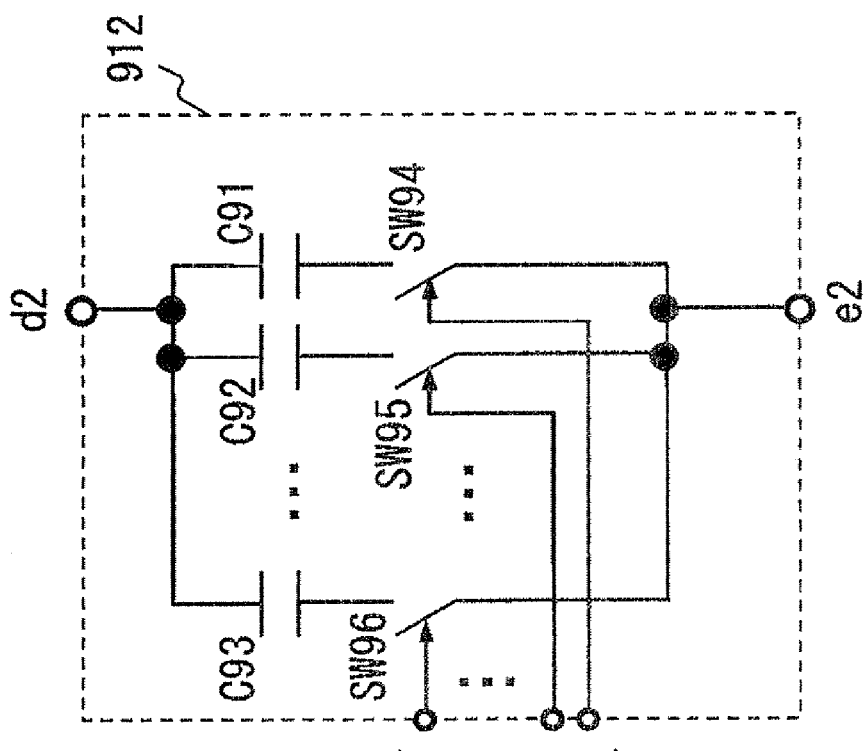
FIG. 15 illustrates a variable capacitor configured in a digital manner.
Figure 15:
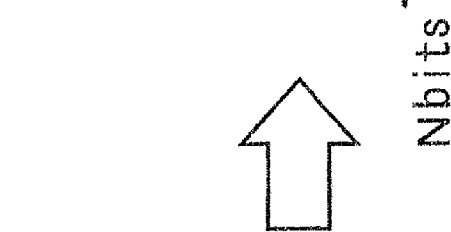
Figure 15:
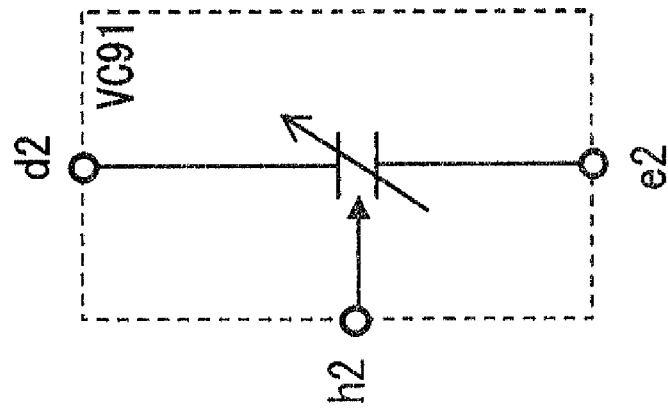

Next, a circuit example of the digital variable capacitor VC91 is shown in FIG. 15. If terminals and a control terminal of the digital variable capacitor VC91 are respectively set as d2 and e2, and h2, the digital variable capacitor VC91 can be configured as a digital variable capacitor circuit 912, for example. Note that the digital variable capacitor VC92 can also be realized by the same circuit.

In the digital variable capacitor circuit 912, N-number of switches SW94 through SW96 are coupled in series with N-number of capacitors C91 through C93 and are coupled in parallel between the terminals d2 and e2 of the variable capacitor VC91. What corresponds to the control terminal h2 is N-bits control inputs which control on-off of the respective N-number of switches SW94 through SW96. Note that a logic of an on-off control of the N-number of switches SW94 through SW96 is set inversely with respect to the logic of the on-off control of the N-number of switches SW91 through SW93 of the variable resistor circuit 910. For instance, the N-number of switches SW91 through SW93 are turned on at a logic "1", and the N-number of switches SW94 through SW96 are turned on at a logic "0".

Specifically, when the number of N-number of switches being turned on increases, the number of capacitors coupled in parallel with the switches also increases, resulting that the capacitance value between the terminals d2 and e2 is increased. On the contrary, when the number of N-number of switches being turned off increases, the number of capacitors coupled in parallel with the switches decreases, resulting that the capacitance value between the terminals d2 and e2 is decreased.

Further, the decoder 905 operates similarly to the digital variable resistors VR91 and VR92, and performs the logical operation so that the number of switches SW94 through 96 being turned on/off is changed in accordance with a magnitude of the value of the M-bit digital data output from the A/D (analog-to-digital) converter 903. For example, the logical operation is performed so that all of the N-number of switches are turned off when the value of the M-bit digital data output from the A/D (analog-to-digital) converter 903 takes the maximum value, and, on the contrary, all of the N-number of switches are turned on when the digital value takes the minimum value. As a result of this, when the output of the analog control signal generation circuit 303 is large, namely, when the peak voltage held in the sample and hold circuit 902 is larger than the reference voltage of the analog control signal generation circuit 303, a lot of N-number of switches are turned off, which increases the capacitance value, resulting that the control is conducted to lower the peak of the peaking. On the contrary, when the peak voltage held in the sample and hold circuit 902 is smaller than the reference voltage of the analog control signal generation circuit 303, a lot of N-number of switches are turned on, which decreases the capacitance value, resulting that the control is conducted to enlarge the peak of the peaking.

As above, by converting the output voltage of the analog control signal generation circuit 303 into the digital data using the A/D (analog-to-digital) converter 903 and the decoder 905, it is possible to vary the circuit characteristic in a digital manner, and it becomes easy to control by a microprocessor using software. Particularly, by varying the characteristic in a digital manner, it becomes possible to easily conduct a test and an adjustment at the time of mass production, and a quality control and the like of the products by a database can also be easily conducted.

Figure 16:
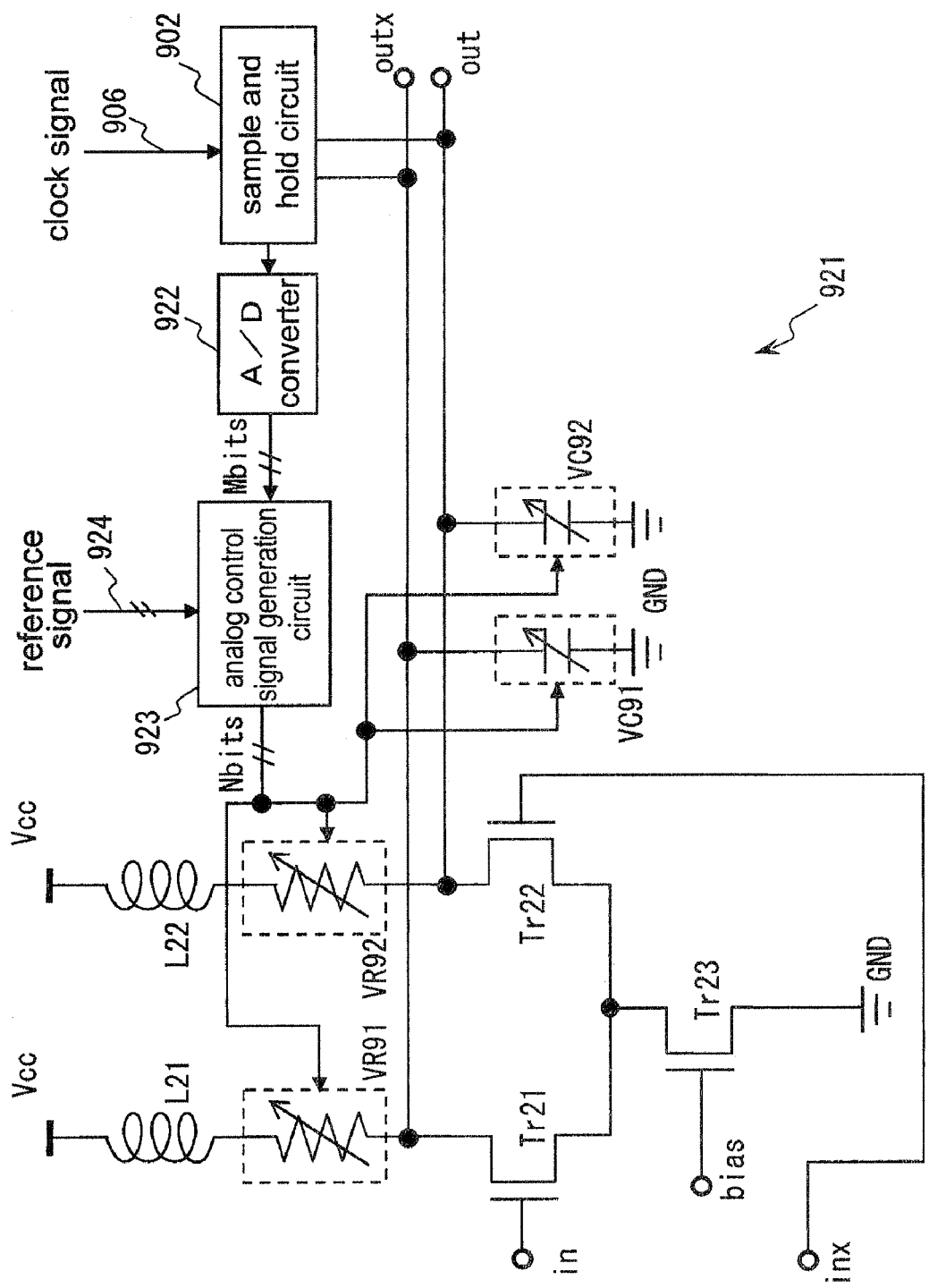
FIG. 16 illustrates a peaking control circuit according to a fifth embodiment.

Next, a peaking control circuit 921 according to a fifth embodiment will be described using FIG. 16. The peaking control circuit 921 is provided with a digital control signal generation circuit 923 instead of the analog control signal generation circuit 303 in FIG. 4. The peak voltage held in the sample and hold circuit 902 is converted into M-bit digital data in an A/D (analog-to-digital) converter 922. The M-bit digital data is input into the digital control signal generation circuit 922, the digital data indicating the M-bit peak voltage and a digital reference voltage 924 given from the microprocessor or the like are compared, and when the peak voltage is larger than the reference voltage 924, N-bit digital data varying the digital variable resistors VR91 and VR92 and the digital variable capacitors VC91 and VC92 is output so as to lower the peak of the peaking.

Note that a method in which the peak voltage converted into the digital data in the A/D (analog-to-digital) converter 922 and the reference voltage set by the digital data are compared, and the digital variable resistors VR91 and VR92 and the digital variable capacitors VC91 and VC92 are varied based on a magnitude relation of the voltages is the same as that of the fourth embodiment, so that an explanation thereof will be omitted.

As described above, all of the peak voltages held in the sample and hold circuit 902 can be processed in a digital manner after being converted into the M-bit digital data in the A/D (analog-to-digital) converter 922, which enables to further easily conduct a software control by the microprocessor compared to the fourth embodiment.

Figure 17:
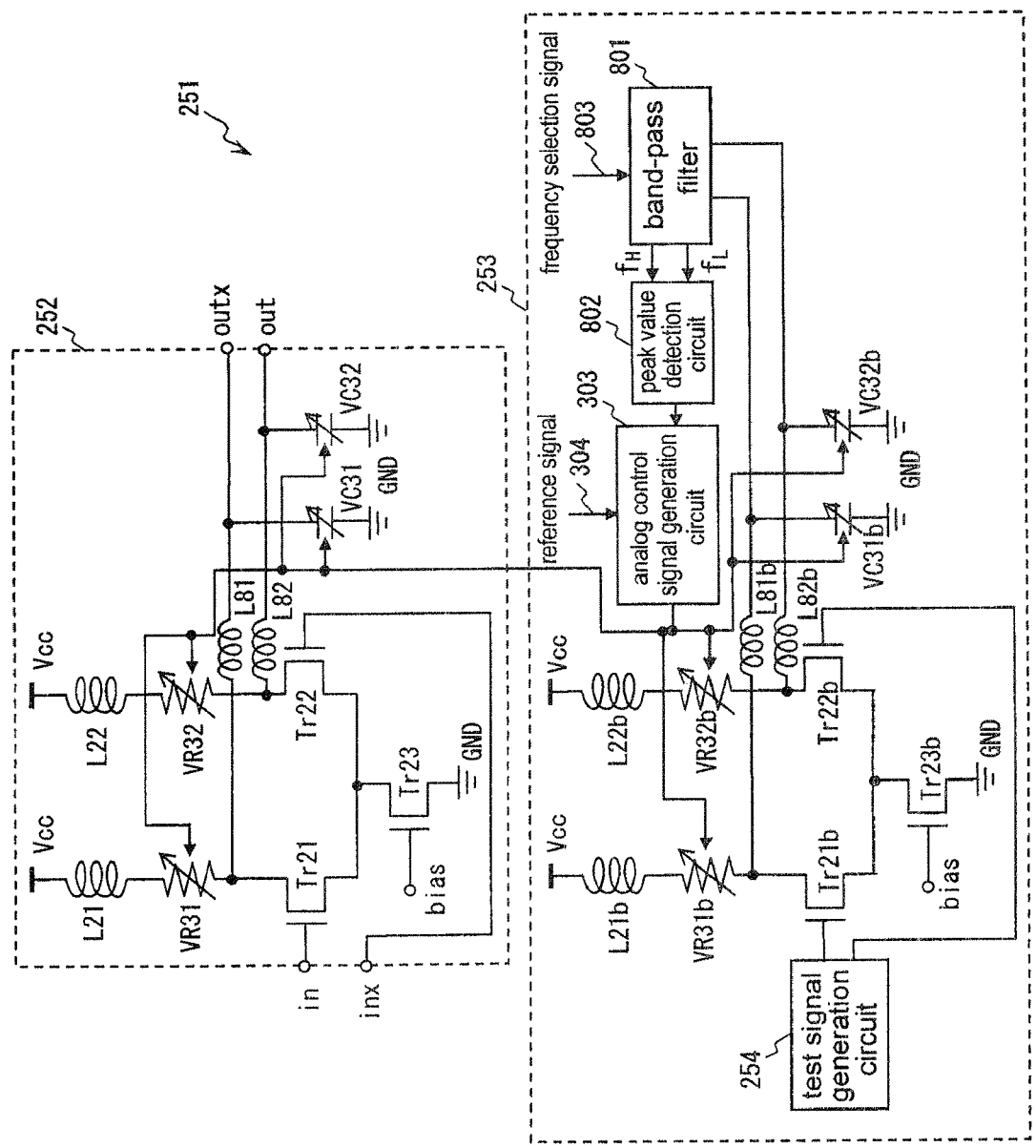
FIG. 17 illustrates a peaking control circuit according to a sixth embodiment.

Next, a peaking control circuit 251 according to a sixth embodiment will be described using FIG. 17. In the peaking control circuit 251, the peak value detection circuit is not provided in a transmission circuit 252 between the non-inverted input signal in and the inverted input signal inx and the non-inverted output signal out and the inverted output signal outx, and only the variable resistances VR31 and VR32 and the variable capacitors VC31 and VC32 for the control are provided. Meanwhile, a replica circuit 253 having the same circuit configuration as that of the transmission circuit 252 of a main signal is provided, and the replica circuit 253 is configured to control the variable resistances VR31 and VR32 and the variable capacitors VC31 and VC32.

The replica circuit 253 is formed of inductors L21$b$ and L22$b$, variable resistances VR31$b$ and VR32$b$, variable capacitors VC31$b$ and VC32$b$, nMOS type transistors Tr21$b$, Tr22$b$ and Tr23$b$, a band-pass filter 801, a peak value detection circuit 802, the analog control signal generation circuit 303 and a test signal generation circuit 254. Note that the elements denoted by the same reference numerals as in FIG. 4 and FIG. 11 indicate the same elements.

Here, the inductors L21$b$ and L22$b$, the variable resistances VR31$b$ and VR32$b$, the transistors Tr21$b$ through Tr23$b$, and the variable capacitors VC31$b$ and VC32$b$ are formed in the same design and in the same semiconductor process as the inductors L21 and L22, the variable resistances VR31 and VR32, the transistors Tr21 through Tr23, and the variable capacitors VC31 and VC32, respectively.

Further, the replica circuit 253 has basically the same configuration as in FIG. 11 and operates in the same manner, in which it operates by inputting a test signal generated by the test signal generation circuit 254 into the non-inverted input signal in and the inverted input signal inx.

The test signal generation circuit 254 generates complementary signals such as alternate codes of "0" and "1" and a PRBS (pseudo random code), and the signals are input into gates of the transistors Tr21*b* and Tr22*b*.

In the peaking control circuit 251 according to the present embodiment, an analog control signal generation circuit 304 of the replica circuit 253 controls values of the variable resistances VR31*b* and VR32*b* and the variable capacitors VC31*b* and VC32*b* in accordance with the test signal generated by the test signal generation circuit 254. Note that the operation in this case is the same as that in FIG. 11, so that an explanation thereof will be omitted.

The control signals output from the analog control signal generation circuit 304 of the replica circuit 253 are output not only to the variable resistances VR31*b* and VR32*b* and the variable capacitors VC31*b* and VC32*b* of the replica circuit 253 but also to the variable resistances VR31 and VR32 and the variable capacitors VC31 and VC32 of the transmission circuit 252 of the main signal, and the variation is performed in the same manner. For instance, when enlarging the values of the variable resistances VR31*b* and VR32*b* to lower the peaking in the replica circuit 253, it is controlled so that the values of the variable resistances VR31 and VR32 of the transmission circuit 252 of the main signal also become large. In like manner, when enlarging the values of the variable capacitors VC31*b* and VC32*b*, it is controlled so that the values of the variable capacitors VC31 and VC32 of the transmission circuit 252 of the main signal also become large. On the contrary, when reducing the values of the variable resistances VR31*b* and VR32*b* to increase the peaking, it is controlled so that the values of the variable resistances VR31 and VR32 of the transmission circuit 252 of the main signal also become small. In like manner, when reducing the values of the variable capacitors VC31*b* and VC32*b*, it is controlled so that the values of the variable capacitors VC31 and VC32 of the transmission circuit 252 of the main signal also become small.

As described above, the peaking control of the transmission circuit 252 of the main signal can be conducted using the signal generated by the test signal generation circuit 254 of the replica circuit 253 without detecting the peak value by monitoring the signal of the transmission circuit 252 of the main signal. Generally, there is a problem that if an additional circuit such as a peak value detection circuit is added to the transmission path of the main signal, a characteristic of the main signal is changed due to the added circuit, and the present embodiment can be applied to such a case.

Further, since the replica circuit 253 is simultaneously manufactured with the main signal of the transmission circuit 252 in the same semiconductor process, a manufacturing variation is reduced. Further, since the environment to use the LSI such as a temperature is also the same, the characteristic variation is small, and the control similar to the control by the configuration of FIG. 4 in which the peak value is detected from the transmission path of the main signal can be realized.

Note that the replica circuit 253 is not necessarily to have the circuit configuration in FIG. 11, and may have a circuit configuration same as that of the other embodiments.

Figure 18:
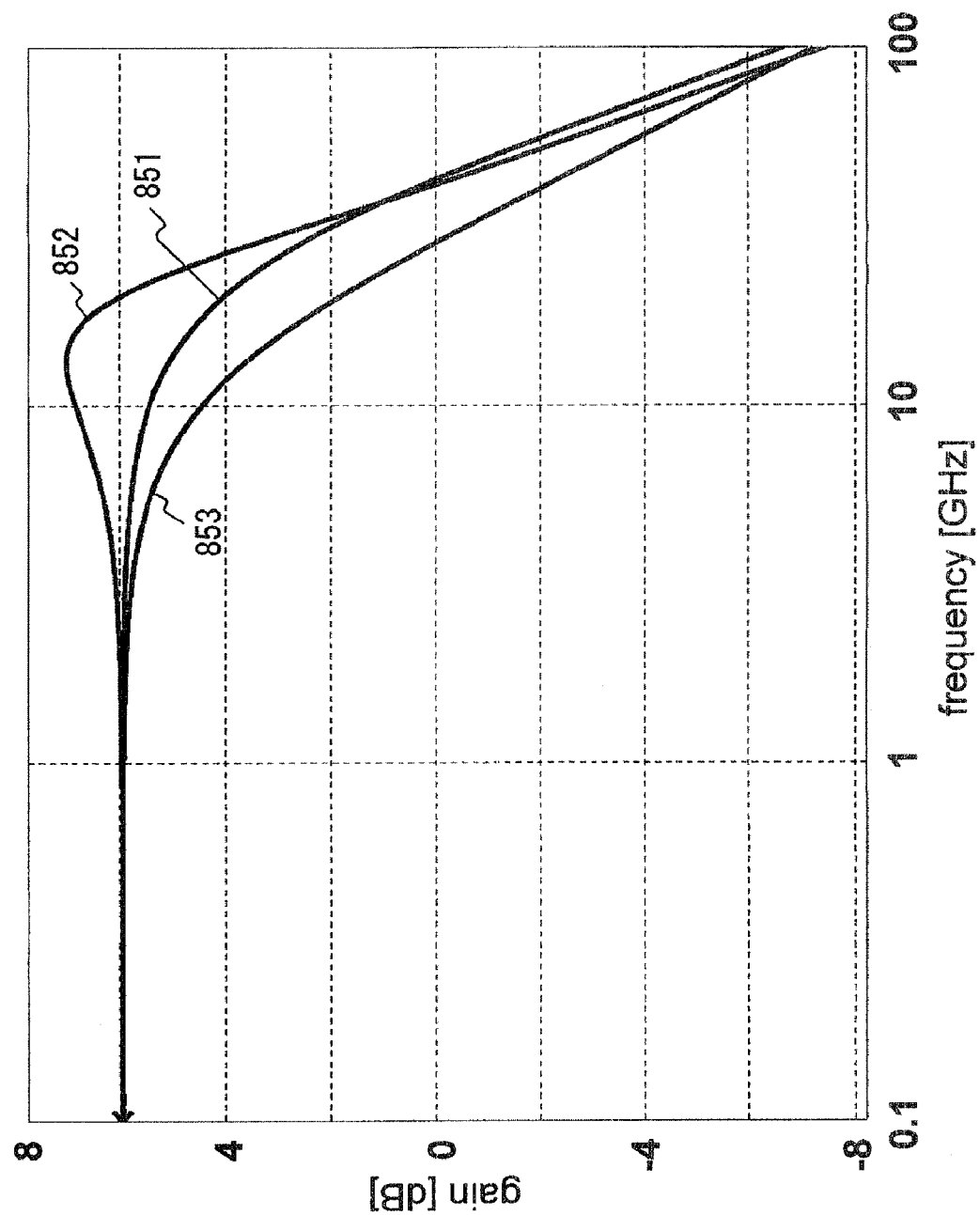
FIG. 18 illustrates frequency characteristics in a simulation.

Lastly, an effect of the peaking control circuit according to the present embodiment will be described using simulation results. FIG. 18 shows a result in which the frequency characteristic of the inductor peaking circuit is simulated in cases where the optimal pealing control is conducted and where the peaking control is not conducted. Note that a horizontal axis indicates a frequency (GHz) and a vertical axis indicates a gain (dB).

In FIG. 18, a frequency wave form 851 indicates the frequency characteristic when the optimal peaking control is conducted, in which the optimal characteristic where the peaking is gradually attenuated from a point in the vicinity of 10 GHz is obtained. On the contrary, a wave form 852 indicates the frequency characteristic when an excess of peaking is applied, in which a large peak is generated from a point in the vicinity of 10 GHz. Further, a wave form 853 indicates the frequency characteristic when the peaking is deficient, in which the peaking is largely attenuated from a point before the vicinity of 10 GHz.

Figure 19:
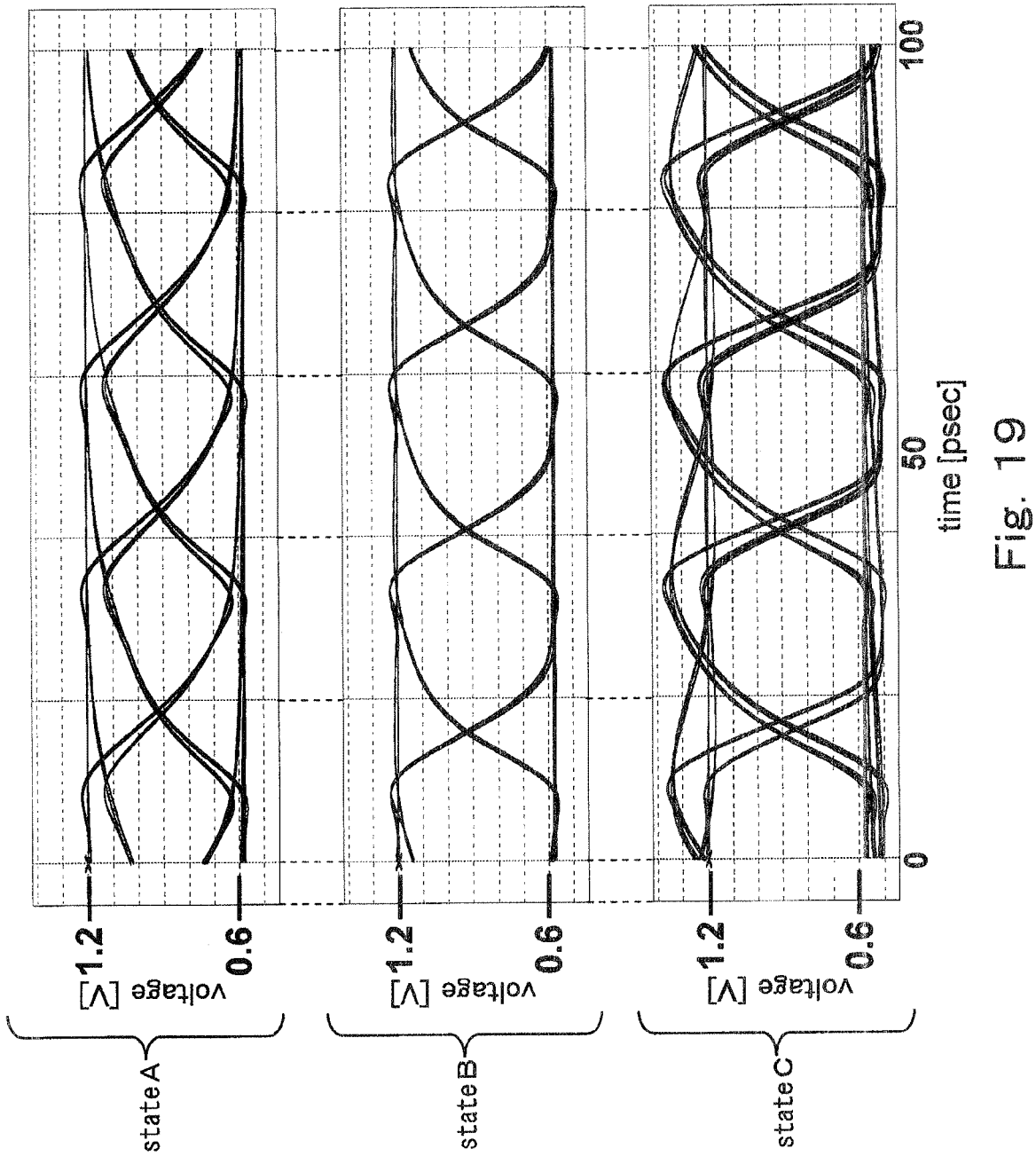
FIG. 19 illustrates eye wave-forms in a simulation.

FIG. 19 shows a result where an eye wave-form of the signal is simulated in cases where the optimal peaking control is conducted and where the peaking control is not conducted. Note that a horizontal axis indicates time (psec) and a vertical axis indicates voltage (V), and the time axes of a state A, a state B and a state C are the same.

In FIG. 19, the state A indicates the eye wave-forms when the peaking is deficient, in which a signal wave form is obtuse, so that an opening of the eye is insufficient, which may generate a data error in the worst case. The state B indicates the eye wave-forms when the optimal peaking control is conducted, in which the eyes are finely opened between 0.6 V to 1.2 V of the signal voltage, which enables to realize a high-quality data transmission. Meanwhile, the state C indicates the eye wave-forms when the excess of peaking is applied, in which a signal distortion beyond 1.2 V is generated, which increases an influence on the circuit.

As described above, the peaking control circuit according to the present embodiment can control the peaking so that the peaking is constantly in a stable state without being in excess or deficient even if there is the manufacturing variation in the circuit element, the semiconductor process or the like, a change in the operating environment such as the power-supply voltage and the temperature, or the like, so that the data transmission of high-quality with no data errors can be realized.

A proposition of the present embodiment is to provide a peaking control circuit capable of constantly conducting an optimal peaking control even if there is a manufacturing variation in a circuit element, a semiconductor process or the like, a change in an operating environment such as a power-supply voltage and a temperature, or the like.

One aspect of the present embodiment is provided with a peaking detection part detecting a peaking amount in an output part of an inductor peaking circuit and a control signal generation part varying a circuit parameter of the inductor peaking circuit based on the peaking amount detected by the peaking detection part.

Particularly, the inductor peaking circuit has inductors and resistors inserted in series between the output part and a power supply, and capacitances coupled in parallel between the output part and an earth (GND), and depending on respective values of these inductors, resistors and capacitances, it is possible to suppress a peaking generated in the output part.

The peaking detection part monitors a signal in the output part to thereby detect the peaking amount, and the control signal generation part controls a parameter of the circuit so that the peaking amount in the output part is reduced when it is large, and on the contrary, when a characteristic is reduced, a peak is elevated.

For instance, the peaking amount detected by the peaking detection part is monitored, and the values of the resistors or the capacitances are varied so that the peaking amount is reduced. Alternatively, active elements such as transistors are used instead of the resistors, which enables to conduct a further minute control and to speed up a tracking ability. Further, if the capacitance is equivalently varied by varying a bias voltage of varactors or the transistors, it becomes easy to conduct an electrical control. Further, the control signal generation part performs a control in a digital manner. For instance, by controlling the resistance values and the capacitance values in a digital manner, it becomes difficult to be affected by a noise in the circuit, and it is possible to improve a linearity of a control value.

As described above, since the peaking control circuit according to the present embodiment constantly monitors the peaking amount in the output part, it is possible to suppress the generation of the peaking caused not only by a static cause such as a manufacturing variation in a circuit element, a process or the like, but also by a dynamic cause such as a change in an operating environment of a power-supply voltage, a temperature or the like.

In another aspect of the present embodiment, other than an original first inductor peaking circuit to be inserted into a transmission path, a second inductor peaking circuit having the same circuit configuration as that of the first inductor peaking circuit is provided. The second inductor peaking circuit includes a test signal generation part, a peaking detection part detecting a peaking amount in an output part of the second inductor peaking circuit and a control signal generation part varying a circuit parameter of the second inductor peaking circuit based on the peaking amount detected by the peaking detection part. The control signal generation part varies the circuit parameter of the second inductor peaking circuit, and at the same time, it varies the circuit parameter of the first inductor peaking circuit in the same manner.

As described above, the peaking amount in the output part of the second inductor peaking circuit in which a test signal is input is monitored, so that it is not necessary to add an additional circuit to the output part of the first inductor peaking circuit inserted into the original transmission path. As a result of this, it is possible to conduct a peaking control of the first inductor peaking circuit without adversely affecting a signal quality of the original transmission path.

In a preferred example in the aforementioned aspects, a frequency selection part is provided before conducting a peaking detection. The frequency selection part separates a monitor signal in the output part by each frequency component being predetermined set. The peaking detection part detects the peaking by each frequency separated by the frequency selection part. By separating the monitor signal by each frequency, it is possible to suppress only the peaking of a specific frequency. For instance, the peaking detection is conducted by removing a signal having a low-frequency component which may affect the control process, which enables to improve a detection accuracy of the peaking.

The peaking control circuit according to the present embodiment can control the peaking so that the peaking is constantly in a stable state without being in excess or deficient even if there is the manufacturing variation in the circuit element, the semiconductor process or the like, a change in the operating environment such as the power-supply voltage and the temperature, or the like.

The many features and advantages of the embodiments are apparent from the detailed specification and, thus, it is intended by the appended claims to cover all such features and advantages of the embodiments that fall within the true spirit and scope thereof. Further, since numerous modifications and changes will readily occur to those skilled in the art, it is not desired to limit the inventive embodiments to the exact construction and operation illustrated and described, and accordingly all suitable modifications and equivalents may be resorted to, falling within the scope thereof.

What is claimed is:

1. A peaking control circuit, comprising:
   an inductor peaking circuit;
   a peaking detection part detecting a peaking amount in an output part of the inductor peaking circuit; and
   a control signal generation part varying a circuit parameter of the inductor peaking circuit based on the peaking amount detected by the peaking detection part, wherein
   the inductor peaking circuit comprises inductors and resistors inserted in series between the output part and a power supply, and capacitors coupled in parallel between the output part and an earth.

2. The peaking control circuit according to claim 1, wherein the control signal generation part varies values of the resistors so that the peaking amount detected by the peaking detection part is reduced.

3. The peaking control circuit according to claim 2, further comprising
   a first transistor, wherein:
   a source and a drain of the first transistor are coupled in parallel with the resistors; and
   the control signal generation part varies a gate voltage of the first transistor so that the peaking amount detected by the peaking detection part is reduced.

4. The peaking control circuit according to claim 1, wherein
   the control signal generation part varies values of the capacitors so that the peaking amount detected by the peaking detection part is reduced.

5. The peaking control circuit according to claim 4, wherein:
   the capacitors are formed of varactors; and
   the control signal generation part varies a control voltage of the varactors so that the peaking amount detected by the peaking detection part is reduced.

6. The peaking control circuit according to claim 4, further comprising
   a second transistor and a third transistor, wherein:
   a source and a drain of the second transistor are coupled to a source of the third transistor, and a gate of the second transistor and a drain of the third transistor are coupled instead of the capacitors; and
   the control signal generation part varies a gate voltage of the third transistor so that the peaking amount detected by the peaking detection part is reduced.

7. The peaking control circuit according to claim 1, wherein
   the peaking detection part is formed of a circuit detecting a peak voltage.

8. The peaking control circuit according to claim 1, further comprising
   a frequency selection part in the peaking detection part, wherein
   the peaking detection part detects the peaking amount by each frequency output by the frequency selection part.

9. The peaking control circuit according to claim 1, wherein
   the control signal generation part performs a control in a digital manner.

10. A peaking control circuit, comprising:
    a first inductor peaking circuit;
    a test signal generation part;
    a second inductor peaking circuit inputting a test signal output by the test signal generation part;

a peaking detection part detecting a peaking amount in an output part of the second inductor peaking circuit; and a control signal generation part varying a circuit parameter of the first and second inductor peaking circuits based on the peaking amount detected by the peaking detection part.

11. The peaking control circuit according to claim 10, further comprising a frequency selection part in the peaking detection part, wherein the peaking detection part detects the peaking amount by each frequency output by the frequency selection part.

* * * * *